United States Patent
Guo et al.

(10) Patent No.: US 10,950,540 B2
(45) Date of Patent: Mar. 16, 2021

(54) ENHANCING INTEGRATED CIRCUIT DENSITY WITH ACTIVE ATOMIC RESERVOIR

(71) Applicant: Taiwan Semiconductor Manufacturing Co., Ltd., Hsin-Chu (TW)

(72) Inventors: Ta-Pen Guo, Taipei (TW); Ming-Hsien Lin, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/429,350

(22) Filed: Jun. 3, 2019

(65) Prior Publication Data
US 2019/0287897 A1 Sep. 19, 2019

Related U.S. Application Data

(63) Continuation of application No. 15/928,909, filed on Mar. 22, 2018, now Pat. No. 10,312,189, which is a
(Continued)

(51) Int. Cl.
*H01L 23/522* (2006.01)
*H01L 27/118* (2006.01)
(Continued)

(52) U.S. Cl.
CPC ...... *H01L 23/5226* (2013.01); *H01L 23/5228* (2013.01); *H01L 23/53204* (2013.01);
(Continued)

(58) Field of Classification Search
CPC .................................................. H01L 23/5226
See application file for complete search history.

(56) References Cited

U.S. PATENT DOCUMENTS

| 4,827,327 A | 5/1989 | Miyauchi et al. |
| 5,293,069 A | 3/1994 | Kato et al. |

(Continued)

FOREIGN PATENT DOCUMENTS

| CN | 103177147 | 6/2013 |
| KR | 20100057507 | 5/2010 |

(Continued)

OTHER PUBLICATIONS

Oates et al., "Electromigration Failure of Circuit—Like Interconnects: Short Length Failure Time Distributions with Active Sinks and Reservoirs", Jun. 2014, pp. 5A.2.1-5A.2.7, Reliability Physics Symposium, 2014 IEEE International, Waikoloa, HI.
(Continued)

*Primary Examiner* — William A Harriston
(74) *Attorney, Agent, or Firm* — Haynes and Boone, LLP

(57) ABSTRACT

Methods are disclosed herein for fabricating integrated circuit interconnects that can improve electromigration. An exemplary method includes forming a first metal layer of an integrated circuit and forming a second metal layer of the integrated circuit. The first metal layer includes a first conductor electrically coupled to a second conductor, and the second metal layer includes a third conductor electrically coupled to the first conductor. The first conductor, the second conductor, and the third conductor are configured, such that electrons flow from the second conductor to an area of the first conductor where electrons flow from the third conductor to the first conductor.

20 Claims, 16 Drawing Sheets

Related U.S. Application Data continuation of application No. 15/098,894, filed on Apr. 14, 2016, now Pat. No. 9,929,087, which is a continuation-in-part of application No. 14/941,770, filed on Nov. 16, 2015, now Pat. No. 9,818,694.

(51) Int. Cl.

| | | |
|---|---|---|
| *H01L 29/06* | (2006.01) | |
| *H01L 23/532* | (2006.01) | |
| *H01L 27/02* | (2006.01) | |
| *H01L 49/02* | (2006.01) | |

(52) U.S. Cl.
CPC .... *H01L 27/0207* (2013.01); *H01L 27/11807* (2013.01); *H01L 28/00* (2013.01); *H01L 29/0607* (2013.01); *H01L 23/53214* (2013.01); *H01L 23/53223* (2013.01); *H01L 23/53228* (2013.01); *H01L 23/53238* (2013.01); *H01L 23/53242* (2013.01); *H01L 23/53252* (2013.01); *H01L 23/53257* (2013.01); *H01L 23/53266* (2013.01); *H01L 2027/11875* (2013.01); *H01L 2027/11879* (2013.01); *H01L 2027/11881* (2013.01)

(56) References Cited

U.S. PATENT DOCUMENTS

| | | |
|---|---|---|
| 5,696,030 A | 12/1997 | Cronin |
| 5,770,519 A | 6/1998 | Klein et al. |
| 5,963,831 A | 10/1999 | Fu |
| 6,072,945 A | 6/2000 | Aji et al. |
| 6,717,268 B2 | 4/2004 | Hau-Riege |
| 7,301,236 B2 | 11/2007 | Greco et al. |
| 2003/0089996 A1 | 5/2003 | Hau-Riege |
| 2004/0070078 A1 | 4/2004 | Ho et al. |
| 2007/0284724 A1 | 12/2007 | Englekirk |
| 2010/0230824 A1 | 9/2010 | Lee et al. |
| 2010/0237508 A1 | 9/2010 | Utsumi |
| 2013/0140711 A1* | 6/2013 | Iwasaki ................ H01L 23/528 257/774 |
| 2013/0154128 A1 | 6/2013 | Wang et al. |
| 2014/0154630 A1 | 6/2014 | Schmid et al. |

FOREIGN PATENT DOCUMENTS

| | | |
|---|---|---|
| KR | 20120126442 | 11/2012 |
| KR | 20130005185 | 1/2013 |
| KR | 20150077330 | 7/2015 |
| TW | 201535813 | 9/2015 |
| WO | WO9935691 | 7/1999 |
| WO | WO2012053130 | 4/2012 |

OTHER PUBLICATIONS

Lin et al., "An Electromigration Failure Distribution Model for Short-Length Conductors Incorporating Passive Sinks/Reservoirs", 2012, 5 pages, vol. 13, Issue 1, IEEE Transactions of Device and Materials Reliability.

* cited by examiner

ENHANCING INTEGRATED CIRCUIT DENSITY WITH ACTIVE ATOMIC RESERVOIR

This is a continuation application of U.S. patent application Ser. No. 15/928,909, filed Mar. 22, 2018, now U.S. Pat. No. 10,312,189, which is a continuation application of U.S. patent application Ser. No. 15/098,894, filed Apr. 14, 2016, now U.S. Pat. No. 9,929,087, which is a continuation-in-part application of U.S. patent application Ser. No. 14/941,770, filed Nov. 16, 2015, now U.S. Pat. No. 9,818,694, the entire disclosures of which are incorporated herein by reference.

BACKGROUND

Semiconductor integrated circuits (ICs) use metallic interconnects to connect individual devices on a chip. A major challenge to the continued scaling of IC technologies is the electromigration (EM) failure of the metallic interconnects. EM refers to the phenomenon of electric current induced metal self-diffusion. Stated briefly, EM is the transport of material in a conductor arising from the momentum exchange between the electron currents (the "electron wind" force). EM induced material depletion will lead to the development of tensile stress, while accumulation leads to the development of compressive stress at blocking boundaries. A backflow flux originates from the stress gradient and counters the EM flux. If the stress exceeds a critical value required for void nucleation, the line will fail. It is important to assess IC metallization reliability because of the high current densities that circuit interconnects carry. For example, thin film IC interconnects carry relatively high current densities in the range of $10^5$ to $10^6$ A/cm$^2$, which leads to a large flux of atoms in the direction of electron flow. Therefore, there is a need to design and/or manufacture ICs that can withstand the EM impact for the target product lifetime at the target current density.

In one approach, dummy vias (or via plugs) are added to a conductor. A dummy via is non-functional—it does not form part of a signal line. A dummy via is also passive—it is not biased to any voltage. A dummy via is connected to the conductor at one end, and is left floating at the other end. The dummy via becomes a passive atomic reservoir for the conductor. Such approach generally has minor impact on EM because the top surface of the conductor is not the dominant EM diffusion path. Studies have shown that vias are places of atomic flux divergence, making them a primary EM reliability concern. In another approach, dummy lines are added to a conductor by extending the width of the conductor at various places. Such dummy lines become passive atomic reservoir for the conductor. Such approach has its own drawback. When the conductor's current changes direction, a previous passive atomic reservoir may become a passive atomic sink, which worsens the lifetime of EM. Accordingly, improvements in these areas are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
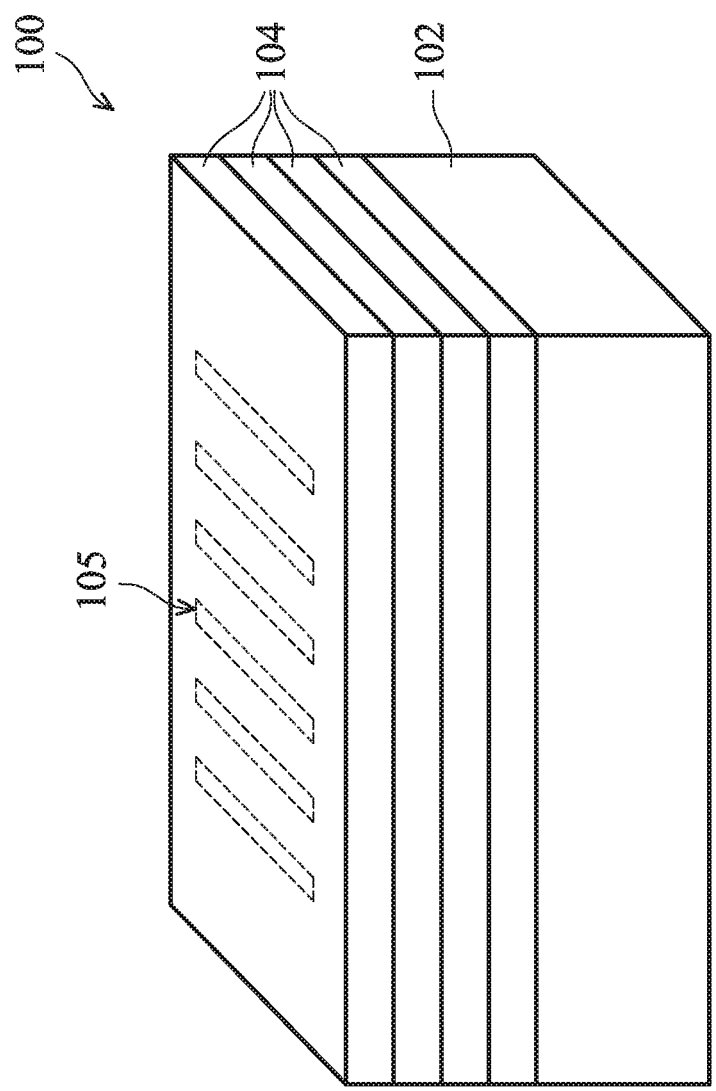
FIG. 1 is a perspective view of an integrated circuit (IC).
Figure 1:
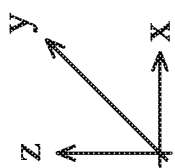

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. For example, features and/or components described with respect to one embodiment may be combined with features and/or components described with respect to other embodiments of the present disclosure to form yet another embodiment of a device, system, or method according to the present disclosure even though such a combination is not explicitly shown. Further, any modifications to the described devices and any further application of the principles of the present disclosure are fully contemplated as would normally occur to one having ordinary skill in the art to which the disclosure relates. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices. More particularly, it is related to multilayer interconnects for integrated circuits (IC). An object of the present disclosure is to provide active atomic reservoirs for improving IC interconnects' reliability in view of EM. The active atomic reservoirs include conductors that are biased to certain voltages of the IC but do not form part of a signal line of the IC. Rather, they act as atomic sources for other conductors to which they are joined. The other conductors may be power rails and/or signal lines of the IC that are susceptible to EM. For example, they may carry high current density when the IC is in operation. In the following discussion, the conductors of the active atomic reservoirs are referred to as atomic source conductors (ASCs), while the conductors to which the ASCs are joined are referred to as the target conductors. The target conductors may comprise power rails and signal lines. In one aspect, the ASCs are short conductors carrying relatively small current density. The ASCs and the target conductors are biased to different voltages such that electrons always flow from the ASCs to the respective target conductors. This effectively makes the ASCs an active supply of the metallic ions, boosting the EM lifetime of the target conductors. Many aspects of the active atomic reservoirs of the present disclosure will be discussed below through a description of embodiments that involve multilayer interconnects in an IC.

FIG. 1 shows a perspective view of an IC 100 constructed according to various aspects of the present disclosure. Referring to FIG. 1, the IC 100 includes a substrate 102 and wiring layers 104 formed over the substrate 102. The wiring layers 104 contain conductive lines (indicated by the phantom lines) and vias (not shown). The various conductive lines and vias form an interconnect structure 105 that connect active (e.g., transistors) and/or passive (e.g., resistors) devices in the substrate 102. It is noted that, in various embodiments, the IC 100 may include any number of wiring layers 104, such as four, five, six, seven, or even more wiring layers.

In embodiments, the substrate 102 includes a silicon substrate (e.g., a wafer). Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 102 is a semiconductor on insulator (SOI). The substrate 102 includes active devices such as p-type field effect transistors (PFET), n-type FET (NFET), metal-oxide semiconductor field effect transistors (MOSFET), complementary metal-oxide semiconductor (CMOS) transistors, bipolar transistors, high voltage transistors, and high frequency transistors. The transistors may be planar transistors or multi-gate transistors such as FinFETs. The substrate 102 may further include passive devices such as resistors, capacitors, and inductors.

The wiring layers 104 include dielectric materials in which the conductive lines and vias of the interconnect structure 105 are embedded. In embodiments, the dielectric materials may include a low-K dielectric material such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In embodiments, the conductive lines may each include an electrically conductive metal-diffusion barrier layer as an outer layer and a metal conductor as an inner layer. For example, the metal-diffusion barrier layer may comprise tantalum (Ta) or tantalum nitride (TaN), and the metal conductor may comprise copper (Cu), aluminum (Al), tungsten (W), cobalt (Co), silver (Ag), gold (Au), and other suitable metals. Similarly, the vias may each include a metal-diffusion barrier layer as an outer layer and a metal plug as an inner layer.

Figure 2:
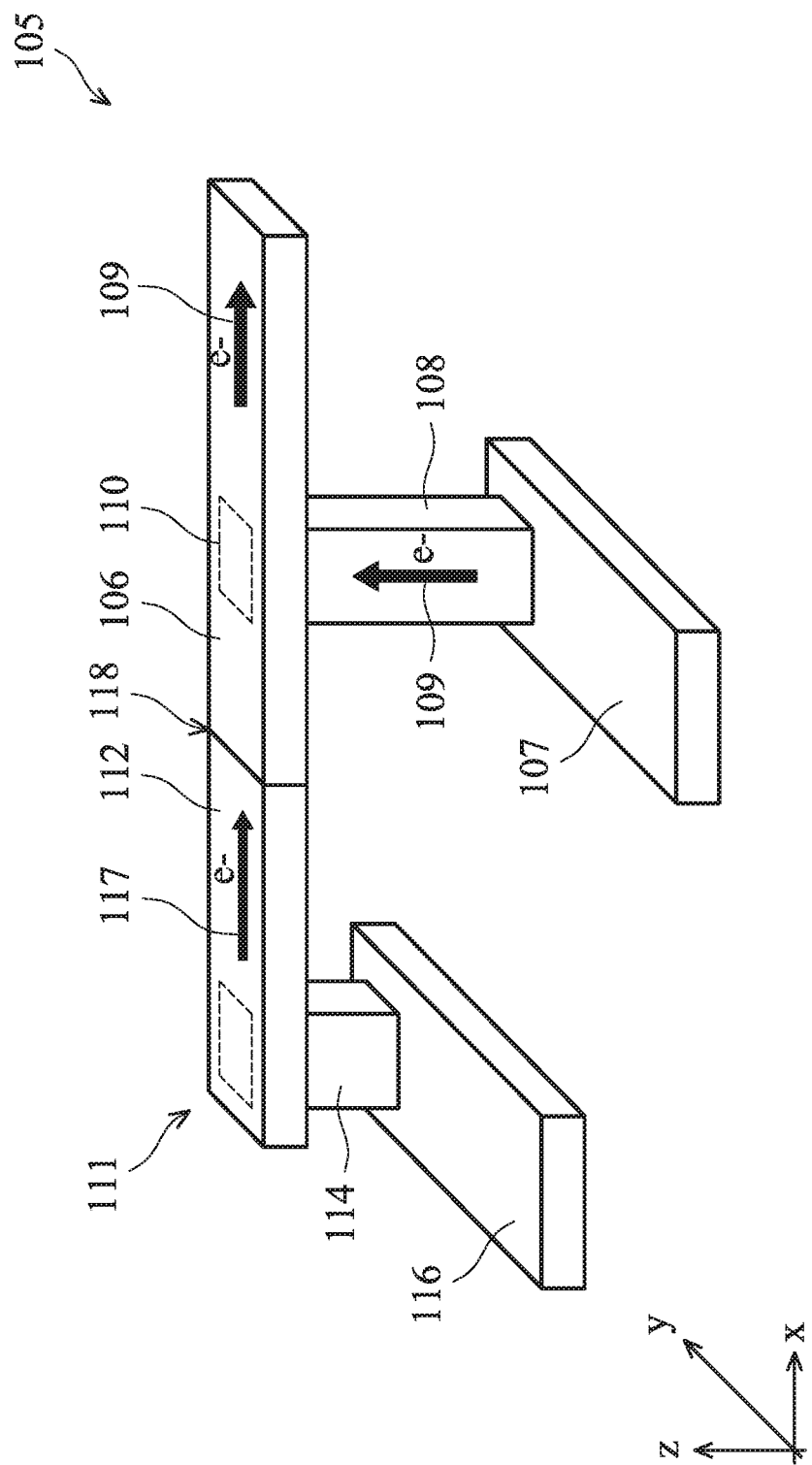
FIG. 2 is a perspective view of a portion of an interconnect structure of the IC of FIG. 1, constructed according to various aspects of the present disclosure.

FIG. 2 shows an example of a portion of the interconnect structure 105, constructed according to various aspects of the present disclosure. Referring to FIG. 2, the interconnect structure 105 includes a first conductor 106 in one wiring layer 104 (FIG. 1) and a second conductor 107 in another wiring layer 104 (FIG. 1). The interconnect structure 105 further includes a metal plug 108 (a part of a via) connecting the first and second conductors, 106 and 107. In embodiments, the first conductor 106, the second conductor 107, and the metal plug 108 may each comprise copper (Cu), aluminum (Al), tungsten (W), cobalt (Co), silver (Ag), gold (Au), or other suitable metals. The metal features 106, 107, and 108 may each be surrounded (or covered) by a metal-diffusion barrier layer. The metal-diffusion barrier layer prevents the metal material of the features 106, 107, and 108 from diffusing into the dielectric material layers of the wiring layers 104. The metal-diffusion barrier layer may be a refractory metal that does not suffer EM. For the purposes of simplicity, the metal-diffusion barrier layers and the dielectric material layers are not shown.

In an embodiment, the first conductor 106, the second conductor 107, and the metal plug 108 are disposed in adjacent wiring layers 104. For example, the second conductor 107 is disposed in the first metal layer (M1), the metal plug 108 is disposed in the first via layer (Via1) over the M1 layer, and the first conductor 106 is disposed in the second metal layer (M2) over the Via1 layer. In one particular example, the metal plug 108 and the first conductor 106 may be formed in one wiring layer 104 using a dual damascene process. In various embodiments, each of the first and second conductors 106 and 107 may be disposed in any of the wiring layers 104, such as in M0, M1, M2, ... Mn metal layers. But, the first and second conductors 106 and 107 are disposed in different wiring layers. Further, the first conductor 106 may be disposed over or under the second conductor 107 in various embodiments.

FIG. 2 further illustrates an electron path 109 that goes through the metal plug 108, along the first conductor 106, and towards the right side of the page (the sink of the electrons are not shown). When the IC 100 is in operation, electrons flow along the path 109. It is noted that current flows in the opposite direction of the electrons. For the convenience of discussion, the direction of the electron flow is used in the present disclosure. The electrons may drag metallic ions from the metal features 106, 107, and 108 along with them. Studies have shown that the areas of the conductor/via where the electron path changes directions are most susceptible to EM. One such area 110 is illustrated in FIG. 2 with the dotted lines on the first conductor 106 above the metal plug 108. If the issue of EM is not dealt with properly, metallic ions may deplete in or near the area 110 over time to cause "open circuit" failures. The present disclosure provides an active atomic reservoir 111 to help alleviate the impacts of EM. FIG. 2 illustrates an embodiment of the active atomic reservoir 111.

Still referring to FIG. 2, in the present embodiment, the active atomic reservoir 111 includes a conductor 112 which is an atomic source conductor (ASC) and a metal plug 114 that connects the ASC 112 to a power rail 116. The ASC 112 is disposed in the same wiring layer 104 as the first conductor 106. The power rail 116 is a voltage source of the IC 100. In an embodiment, the ASC 112 and the metal plug 114 comprise essentially the same material as the first conductor 106 and the metal plug 108, respectively. The ASC 112 and the metal plug 114 may each be surrounded by a metal-diffusion barrier layer (not shown). The power rail 116 and the second conductor 107 may be disposed in the same or different wiring layers 104 (FIG. 1). FIG. 2 further illustrates an electron path 117 where electrons flow from the ASC 112 to the first conductor 106. In the present embodiment, the voltage source for the ASC 112 and the voltage source for the first conductor 106 are configured such that the electron path 117 keeps the same direction in all operational modes of the IC 100. In an embodiment, the current density, $j_{asc}$, along the electron path 117 is equal to or smaller than the current density, $j_c$, along the electron path 109 ($j_{asc} \leq j_c$). In various embodiments, the ratio of ($j_{asc}/j_c$) may be tuned based on design needs. When the ratio increases (decreases), the EM lifetime of the first conductor 106 increases (decreases), but the active atomic reservoir 111's EM lifetime decreases (increases). Further, the length of the ASC 112 may be smaller than the length of the first conductor 106. In an embodiment, the length of the ASC 112 is in a range of 0.02 microns (μm) to 2 μm. The ASC 112 joins the first conductor 106 at an interface 118. In an embodiment, the first conductor 106 and the ASC 112 are formed by the same process and with the same material. In such a case, the interface 118 is only an imaginary boundary, and not a distinguishable interface. In the present embodiment, the ASC 112 has the same width as the first conductor 106. It joins the first conductor 106 at one end of the first conductor 106, and extends along a longitudinal axis of the first conductor 106.

When the IC 100 is in operation, electrons flow along the path 109 according to the operational modes of the IC 100. Metallic ions of the first conductor 106 are dragged along by the electrons and may deplete, e.g., in the area 110. At the same time, metallic ions of the ASC 112 move along the path 117 and inject into the first conductor 106 to replenish the lost metallic ions. This may be effectuated by two forces. First, electrons moving along the path 117 carry with them some metallic ions. Second, as metallic ions in the area 110 deplete, a concentration gradient forms along the path 117. The combined forces make the active atomic reservoir 111 more effective than a dummy atomic reservoir that is not biased to any voltage source (in another word, floating). Further, with a dummy atomic reservoir, if the electron path 109 reverses its direction (e.g., due to reconfiguration of the IC 100), the dummy atomic reservoir might become a passive atomic sink, which would worsen the effects of EM on the first conductor 106. In the present disclosure, the active atomic reservoir 111 keeps the direction of the electron path 117 the same under all operations of the IC 100. Therefore, the active atomic reservoir 111 does not become an atomic sink. This may be realized by properly configuring the respective voltage sources for the ASC 112 and the first conductor 106.

In an embodiment, the active atomic reservoir 111 is formed in the same process that forms other parts of the interconnect structure 105. For example, the power rail 116 and the second conductor 107 may be formed by the same process and in the same wiring layer 104, the metal plugs 114 and 108 may be formed by the same process and in the same wiring layer 104, and the ASC 112 and the first conductor 106 may be formed by the same process and in the same wiring layer 104. In one example, the power rail 116 and the second conductor 107 may be formed by depositing a dielectric layer over the substrate 102 (FIG. 1) (e.g., as part of the first wiring layer 104), etching the dielectric layer to form trenches therein, overfilling the trenches with electrically conductive metal-diffusion barrier layer and a metal conductor, and planarizing a top surface of the IC 100 to remove excessive barrier layer and metal conductor. The remaining metal conductor becomes the second conductor 107 and the power rail 116.

In one example, the metal plugs 114/108 and the conductors 112 and 106 are formed through a dual damascene process, which is briefly described below. First, a dielectric layer is deposited over the wiring layer 104 that contains the power rail 116 and the second conductor 107. Then, the dielectric layer is patterned by lithography processes and etching processes to form trenches therein. Lower portions of the trenches define via holes for the metal plugs 108 and 114, and upper portions of the trenches define a track trench for the first conductor 106 and the ASC 112. Subsequently, one or more electrically conductive metal-diffusion barrier layers are deposited on the sidewalls of the via holes and the track trench, and a metal conductor is deposited over the barrier layers. The barrier layers and the metal conductor overfill the trenches. A chemical mechanical planarization (CMP) process is subsequently performed to remove the excessive material and to planarize the top surface of the IC 100. The remaining metal conductor becomes the metal plugs 108 and 114, the first conductor 106, and the ASC 112.

FIGS. 3-11 illustrate various non-limiting examples of the interconnect structure 105 with active atomic reservoir(s), constructed according to aspects of the present disclosure.

Figure 3:
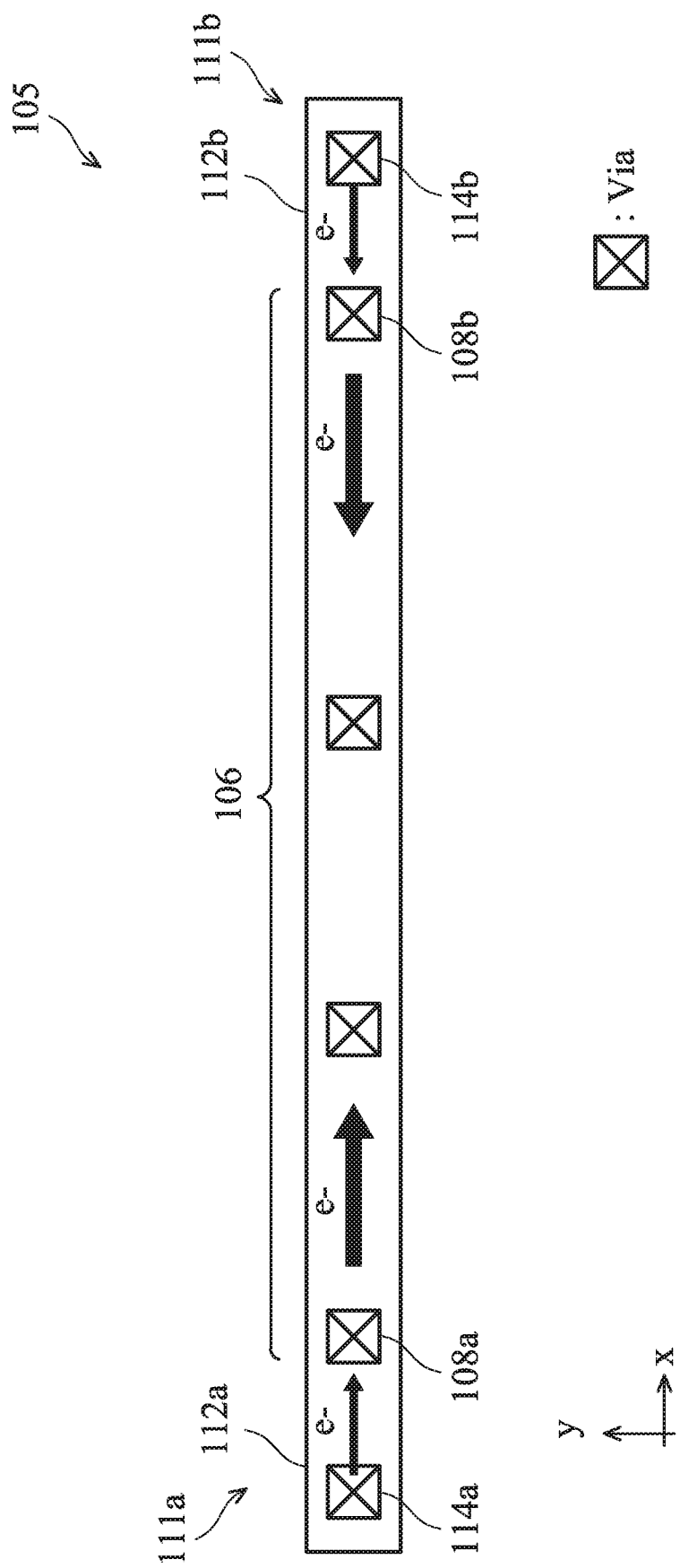
FIGS. 3, 4, 5, 6, 7, 8, 9, and 10 are top view of portions of the interconnect structure of the IC of FIG. 1, in accordance with some embodiments.

Referring to FIG. 3, shown therein is an embodiment of the interconnect structure 105, in portion and in a top view, with a first conductor 106 and two active atomic reservoirs 111a and 111b. The first conductor 106 is connected by two metal plugs 108a and 108b to other conductors or devices of the IC 100. The metal plugs 108a and 108b are disposed near two ends of the first conductor 106. Electrons flow from the metal plugs 108a and 108b to two other vias, respectively, along two segments of the first conductor 106. The metal plugs 108a and 108b, as well as their vicinity, are the concerns for EM. The active atomic reservoir 111a includes an ASC 112a and a metal plug 114a that connects the ASC 112a to a voltage source (not shown) of the IC 100. The active atomic reservoir 111b includes an ASC 112b and a metal plug 114b that connects the ASC 112b to another voltage source (not shown) of the IC 100. The voltage sources for the active atomic reservoirs 111a and 111b may be the same or different. The ASCs 112a and 112b are joined to the first conductor 106 at the two respective ends and extend along the longitudinal axis of the first conductor 106. The ASCs 112a and 112b have the same width as the first conductor 106. Other aspects of the interconnect structure 105 of FIG. 3 are the same as or similar to what have been described with respect to FIG. 2.

Figure 4:
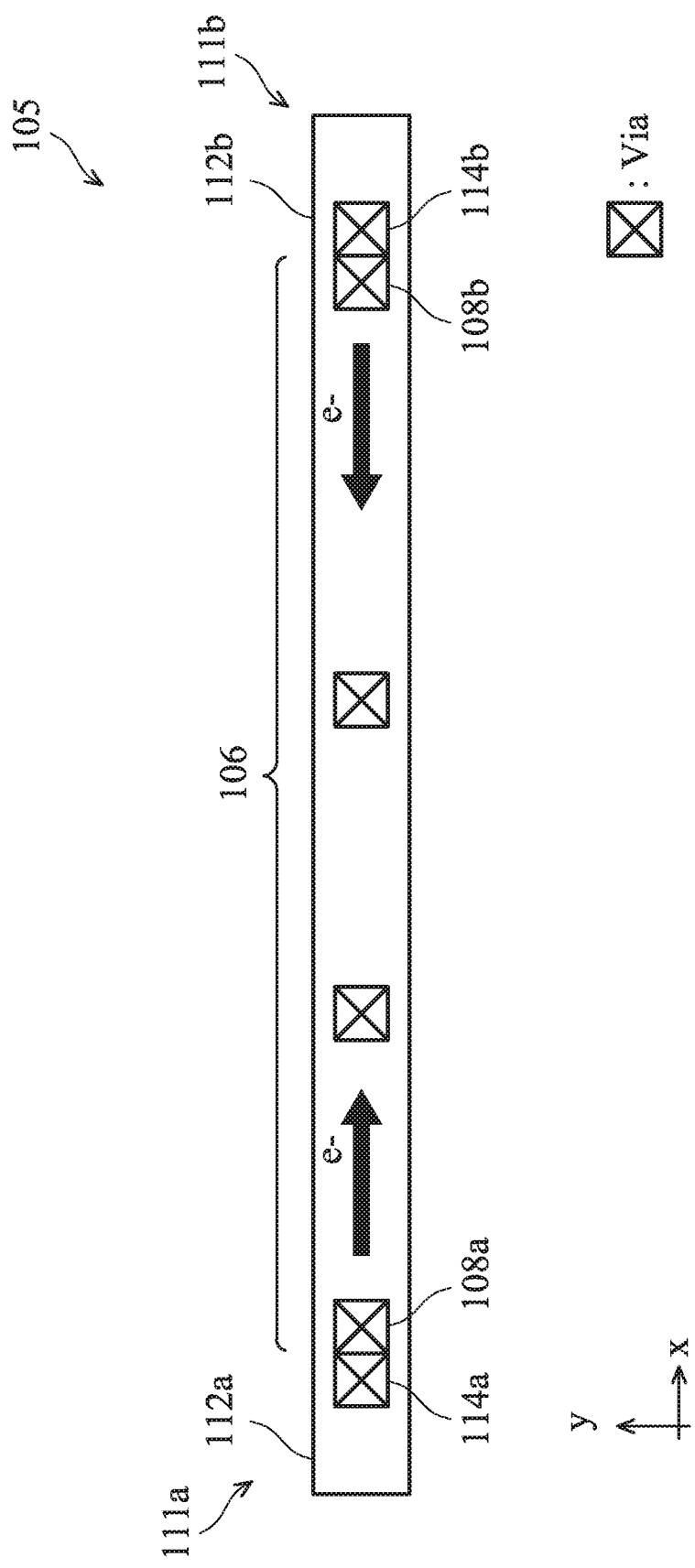

Referring to FIG. 4, shown therein is another embodiment of the interconnect structure 105, in portion and in a top view, with a first conductor 106 and two active atomic reservoirs 111a and 111b. The metal plugs 114a and 114b of the active atomic reservoirs 111a and 111b are joined to the metal plugs 108a and 108b, respectively, to form two rectangular metal plugs. In another word, the metal plugs 114a and 108a are disposed side-by-side and contacting each other, while the metal plugs 114b and 108b are disposed side-by-side and contacting each other. Studies have shown that rectangular metal plugs have higher EM reliability than square metal plugs. Other aspects of the interconnect structure 105 of FIG. 4 are the same as what have been described with respect to FIG. 3.

Figure 5:
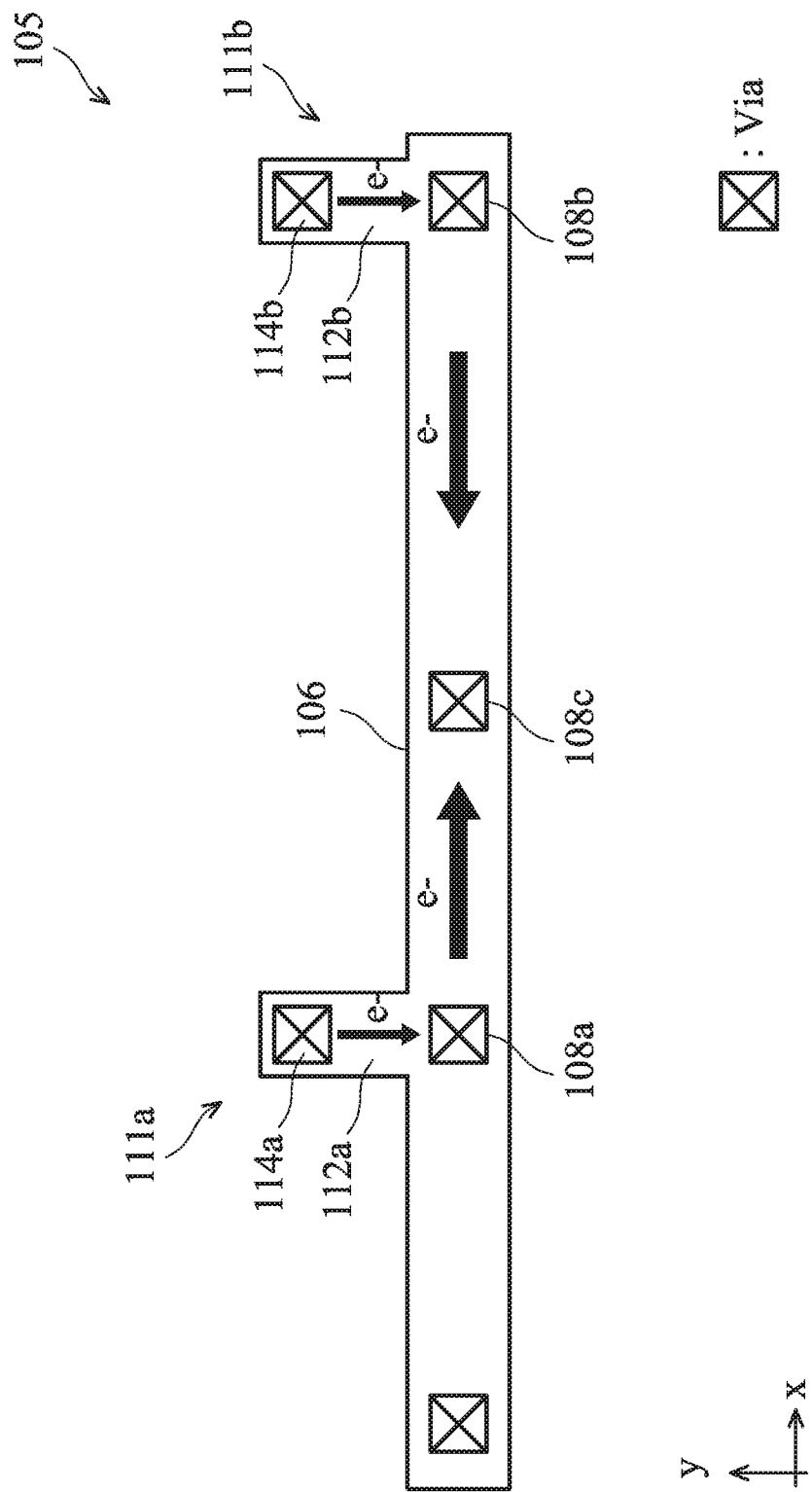

Referring to FIG. 5, shown therein is another embodiment of the interconnect structure 105, in portion and in a top view, with a first conductor 106 and two active atomic reservoirs 111a and 111b. The interconnect structure 105 includes three metal plugs 108a, 108b, and 108c that connect the first conductor 106 to one or more other conductors or devices of the IC 100. The metal plug 108c is disposed between the metal plugs 108a and 108b. By design and in the operational mode as shown, electrons flow from the metal plugs 108a and 108b to the metal plug 108c. The active atomic reservoirs 111a and 111b include ASCs 112a and 112b, respectively, in the same layer as the first conductor 106. The ASCs 112a and 112b are joined to the first conductor 106 proximate to the metal plugs 108a and 108b, respectively, and along a direction perpendicular to the longitudinal axis of the first conductor 106. In the embodiment as shown, the ASCs 112a and 112b are disposed on the same side of the first conductor 106. In an alternative embodiment, the ASCs 112a and 112b are disposed on the opposite sides of the first conductor 106. Other aspects of the interconnect structure 105 of FIG. 5 are the same as what have been described with respect to FIG. 3.

Figure 6:
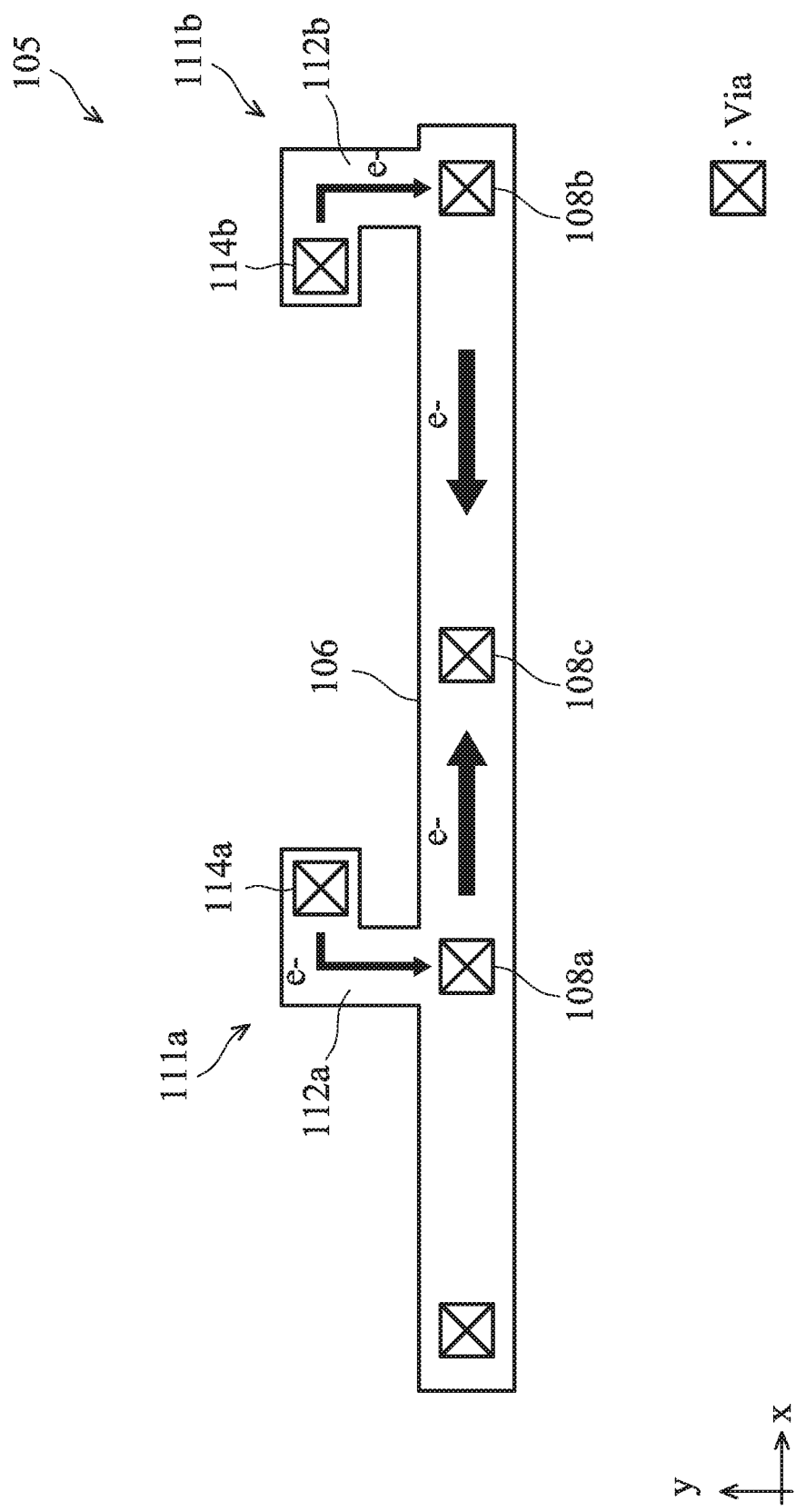

Referring to FIG. 6, shown therein is an embodiment of the interconnect structure 105, in portion and in a top view, with a first conductor 106 and two active atomic reservoirs 111a and 111b. The two active atomic reservoirs 111a and 111b include "L" shaped ASCs 112a and 112b, respectively. In each of the "L" shaped ASCs 112a and 112b, one segment of the ASC is parallel to the first conductor 106 and the other segment of the ASC is joined to the first conductor 106 to form a right angle. Other aspects of the interconnect structure 105 of FIG. 6 are the same as what have been described with respect to FIG. 5. Studies have shown that "L" shaped ASCs and straight line ASCs (e.g., in FIG. 5) have comparable EM lifetime performance. This enhances design flexibility when the widths and lengths of the ASCs are tuned for a particular interconnect structure.

Figure 7:
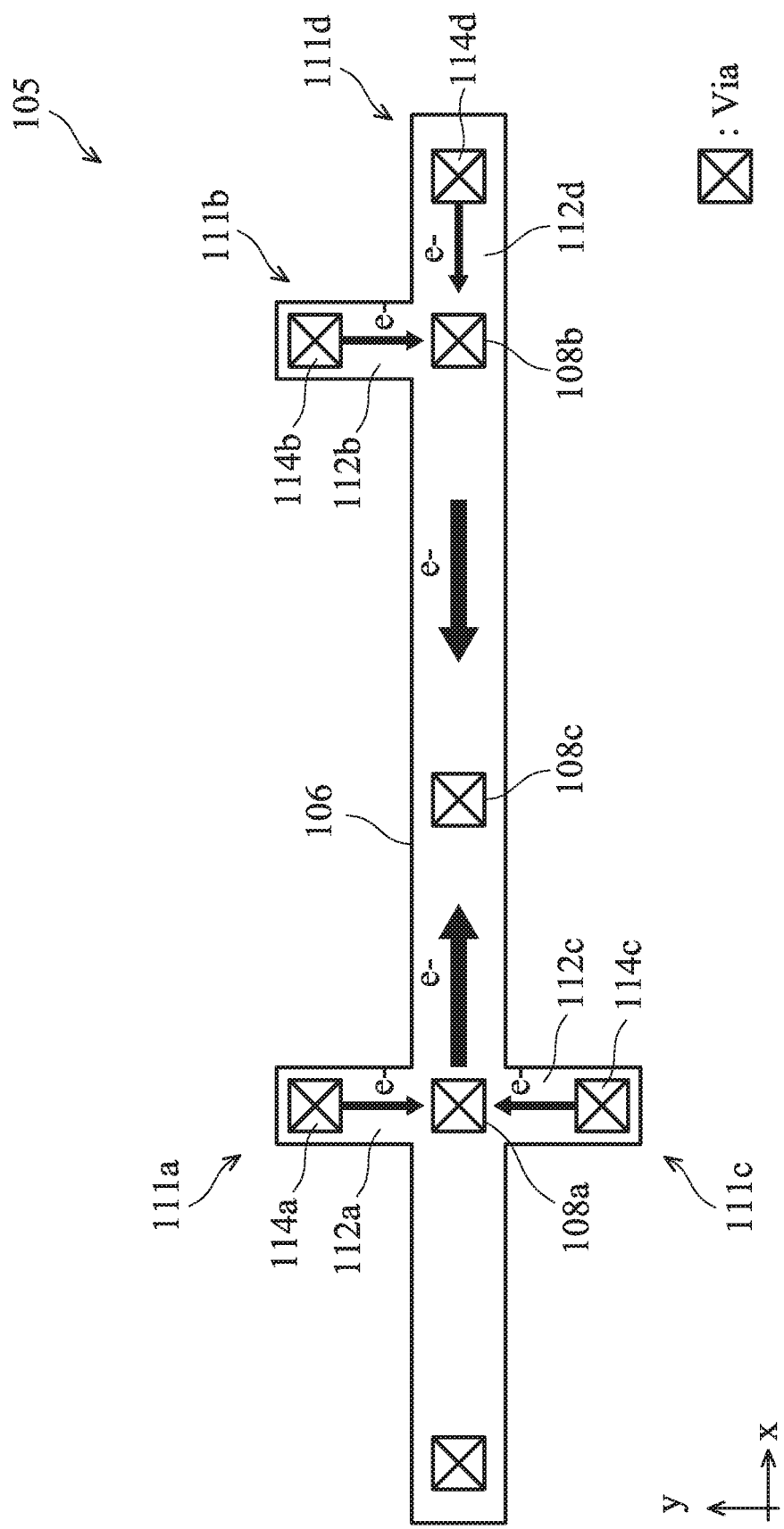

Referring to FIG. 7, shown therein is an embodiment of the interconnect structure 105, in portion and in a top view, with a first conductor 106 and four active atomic reservoirs 111a, 111b, 111c, and 111d. The interconnect structure 105 includes three metal plugs 108a, 108b, and 108c. The metal plug 108c is disposed between the metal plugs 108a and 108b. By design and in the operational mode as shown, electrons flow from the metal plugs 108a and 108b to the metal plug 108c. The active atomic reservoirs 111a-111d include ASCs 112a, 112b, 112c, and 112d, respectively. The ASCs 112a-112d are connected by metal plugs 114a, 114b, 114c, and 114d, respectively, to one or more voltage sources of the IC 100. The ASCs 112a and 112c are joined to the first conductor 106 proximate to the metal plug 108a and on opposite sides of the first conductor 106. The ASCs 112a and 112c are oriented lengthwise along a direction perpendicular to the longitudinal axis of the first conductor 106. The ASCs 112a and 112c provide a stronger boost for the EM performance of the first conductor 106 than a single ASC 112a or 112c. The ASCs 112b and 112d are joined to the first conductor 106 proximate to the metal plug 108b. The ASC 112b is oriented lengthwise along a direction perpendicular to the longitudinal axis of the first conductor 106. The ASC 112d is joined to an end of the first conductor 106 and extends along the longitudinal axis of the first conductor 106. The ASCs 112b and 112d provide a stronger boost for the EM performance of the first conductor 106 than a single ASC 112b or 112d.

Figure 8:
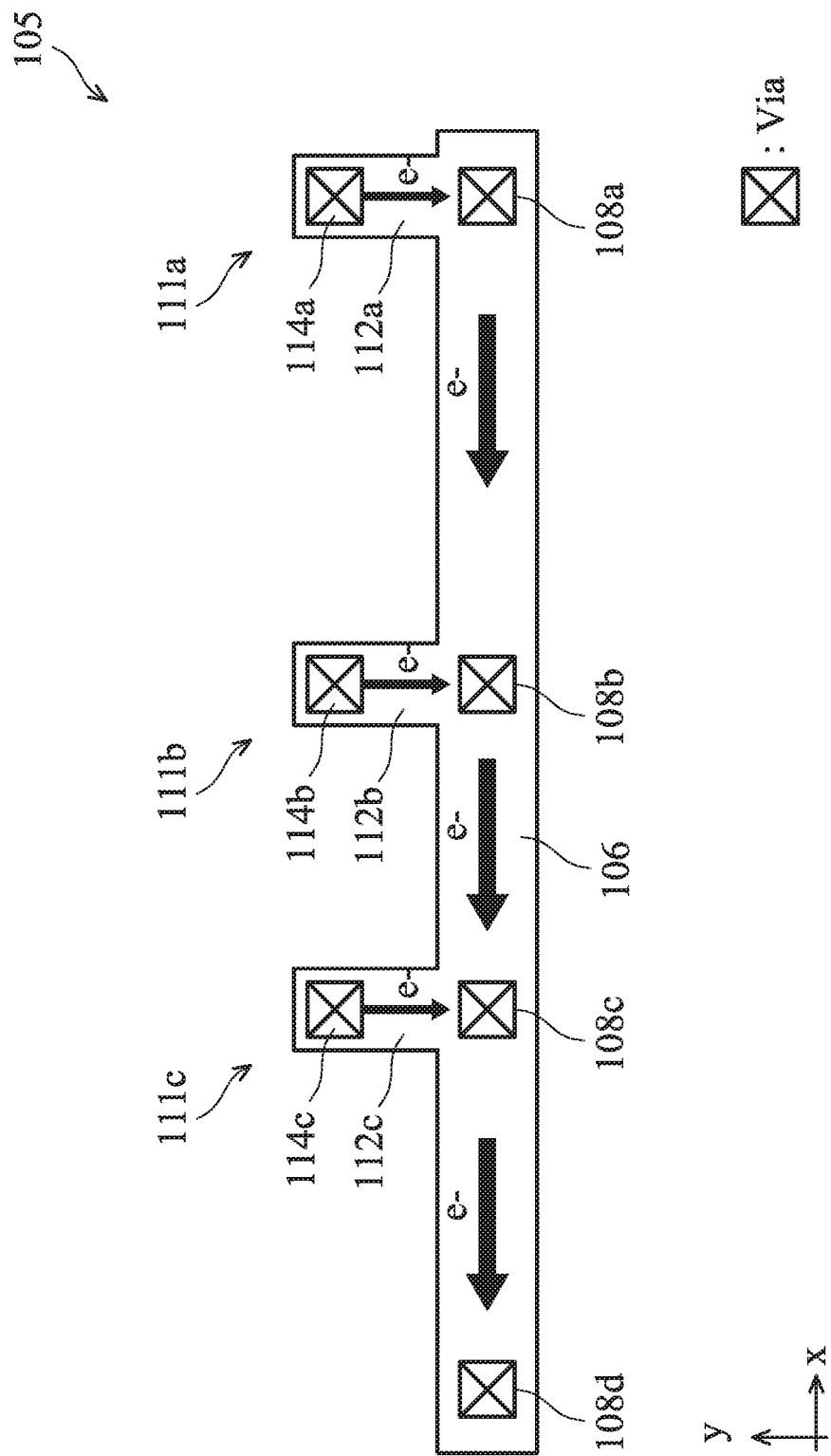

Referring to FIG. 8, shown therein is another embodiment of the interconnect structure 105, in portion and in a top view, with a first conductor 106 and three active atomic reservoirs 111a, 111b, and 111c. The interconnect structure 105 includes four metal plugs 108a, 108b, 108c, and 108d. The metal plugs 108a and 108d are disposed near two ends of the first conductor 106, and the metal plugs 108b and 108c are disposed in the middle portion of the first conductor 106. By design and in the operational mode as shown, electrons flow from the metal plugs 108a, 108b, and 108c to the metal plug 108d along three segments of the first conductor 106. The active atomic reservoirs 111a-111c include ASCs 112a, 112b, and 112c, respectively. Each of the ASCs 112a-112c is joined to the first conductor 106 along a respective direction perpendicular to the longitudinal axis of the first conductor 106. The ASCs 112a, 112b, and 112c may have the same dimension (width, length, shape) or different dimensions, depending on the needs of the EM performance of the three segments of the first conductor 106 to which the ASCs 112a-112c are joined.

Figure 9:
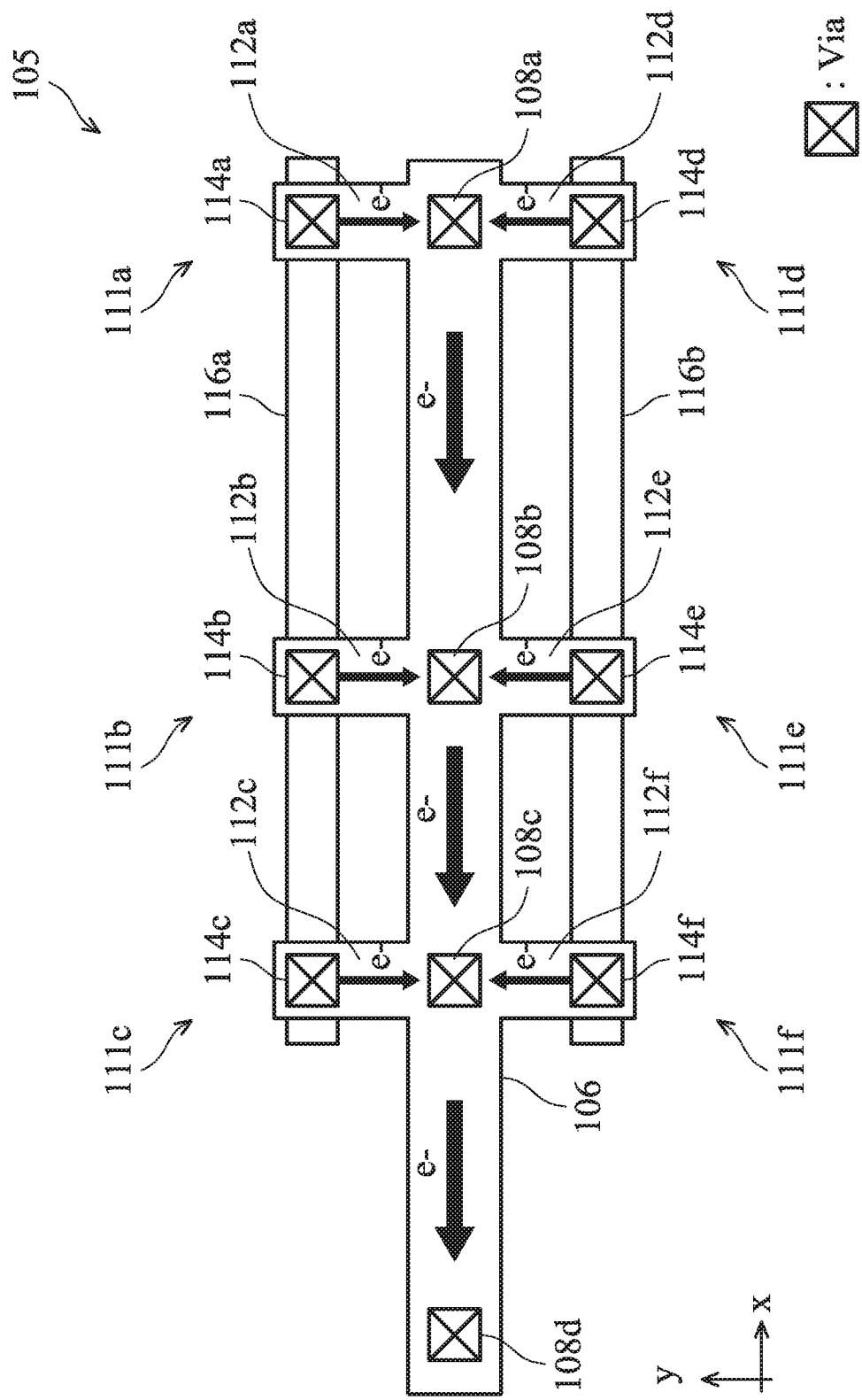

Referring to FIG. 9, shown therein is yet another embodiment of the interconnect structure 105, in portion and in a top view, with a first conductor 106 and six active atomic reservoirs 111a, 111b, 111c, 111d, 111e, and 111f. Similar to the embodiment in FIG. 8, the interconnect structure 105 of the present embodiment includes four metal plugs 108a, 108b, 108c, and 108d. The active atomic reservoirs 111a-111f include ASCs 112a, 112b, 112c, 112d, 112e, and 112f, respectively. The ASCs 112a, 112b, and 112c are connected by metal plugs 114a, 114b, and 114c, respectively, to a first power rail 116a. The ASCs 112d, 112e, and 112f are connected by metal plugs 114d, 114e, and 114f, respectively, to a second power rail 116b. The pair of ASCs, 112a and 112d, is joined to the first conductor 106 proximate to the metal plug 108a. The pair of ASCs, 112b and 112e, is joined to the first conductor 106 proximate to the metal plug 108b. The pair of ASCs, 112c and 112f, is joined to the first conductor 106 proximate to the metal plug 108c. The two power rails 116a and 116b may be disposed in the same wiring layer 104 or different wiring layers 104 (FIG. 1). Each pair of active atomic reservoirs (111a/111d, 111b/111e, and 111c/111f) boosts the EM performance of the respective segment of the first conductor 106.

Figure 10:
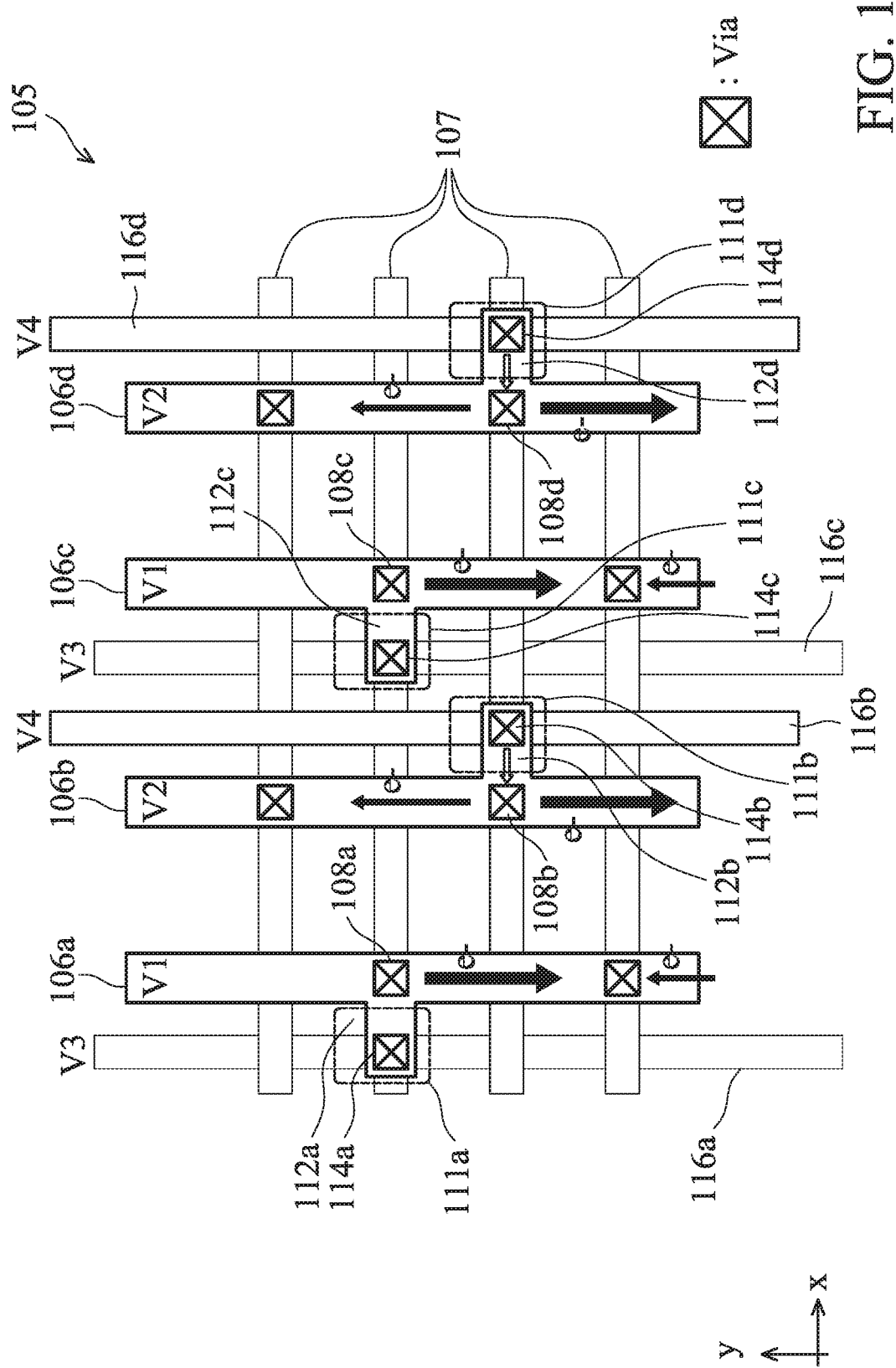

Referring to FIG. 10, shown therein is yet another embodiment of the interconnect structure 105, in portion and in a top view. The interconnect structure 105 includes four voltage sources labeled as V1, V2, V3, and V4. The interconnect structure 105 further includes conductors 106a, 106b, 106c, and 106d. The conductors 106a and 106c are connected (or biased) to the voltage source V1, making them power rails for the voltage source V1. Similarly, the conductors 106b and 106d are connected (or biased) to the voltage source V2, making them power rails for the voltage source V2. The interconnect structure 105 further includes conductors 116a, 116b, 116c, and 116d. The conductors 116a and 116c are power rails for the voltage source V3. The conductors 116b and 116d are power rails for the voltage source V4. The conductors 106a-106d and 116a-116d are oriented lengthwise along the "y" direction. In an embodiment, the conductors 106a-106d are disposed in the same wiring layer 104 (FIG. 1) (e.g., M2 layer), the conductors 116a and 116c are disposed in the same wiring layer 104 (e.g., M0 layer), and the conductors 116b and 116d are disposed in the same wiring layer 104 (e.g., M3 layer). In another embodiment, all or a portion of the conductors 106a-106d and 116a-116d are disposed in the same wiring layer 104.

The interconnect structure 105 further includes conductors 107 oriented lengthwise along the "x" direction in a wiring layer 104 different from where the conductors 106a-106d and 116a-116d are disposed. The interconnect structure 105 further includes metal plugs 108a, 108b, 108c, and 108*d* that connect the conductors 106*a*-106*d*, respectively, to one or more of the conductors 107.

The interconnect structure 105 further includes active atomic reservoirs 111*a*, 111*b*, 111*c*, and 111*d*. The active atomic reservoirs 111*a*-111*d* include ASCs 112*a*, 112*b*, 112*c*, and 112*d*, respectively, in the same wiring layer 104 as the conductors 106*a*-106*d*. The ASCs 112*a*-112*d* are oriented lengthwise along the "x" direction, and are joined to the conductors 106*a*-106*d* proximate to the metal plugs 108*a*-108*d*, respectively. The active atomic reservoirs 111*a*-111*d* further include metal plugs 114*a*, 114*b*, 114*c*, and 114*d*. The metal plugs 114*a*-114*d* connect the ASCs 112*a*-112*d* to the power rails 116*a*-116*d* respectively. The active atomic reservoirs 111*a*-111*d* are integrated with other parts of the interconnect structure 105 to form a mesh structure.

Figure 11:
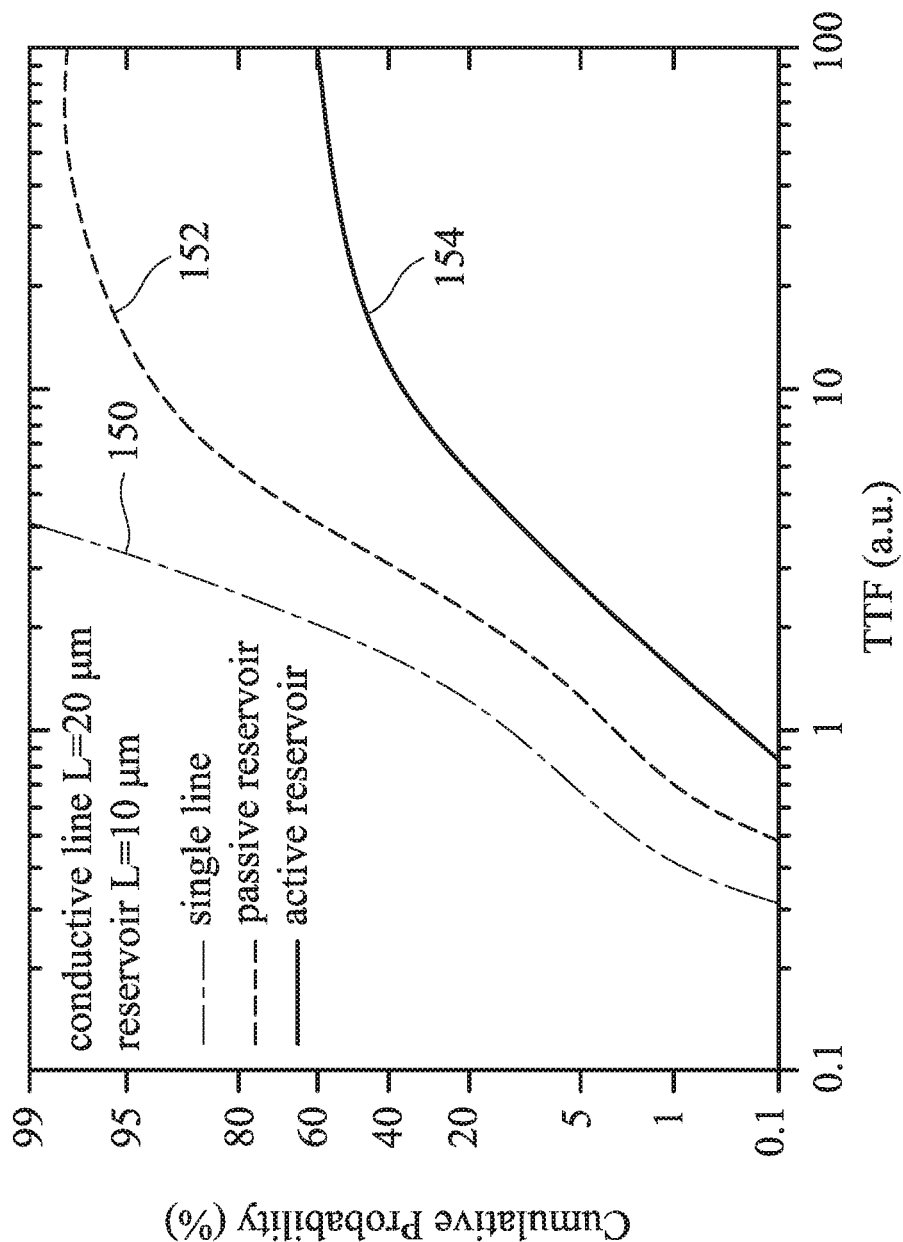
FIG. 11 is a graph showing improvements in EM reliability with an embodiment of the present disclosure.

FIG. 11 illustrates some benefits of an embodiment of active atomic reservoir, constructed according to aspects of the present disclosure. Referring to FIG. 11, the graphs 150, 152, and 154 illustrate EM performance of three conductors through simulations. The horizontal axis is the normalized time-to-failure, and the vertical axis is the cumulative probability of failure due to EM. The three conductors have the same length (L=20 μm) and the same width, and comprise the same material. The first conductor, associated with the graph 150, does not have either passive or active atomic reservoir (e.g., the conductor 106 in FIG. 3). It serves as the reference point for the comparison. The second conductor, associated with the graph 152, is joined by a passive atomic reservoir with a length of 10 μm (such as the conductor 112*a* of FIG. 3 with the metal plug 114*a*, but without voltage biasing). The third conductor, associated with the graph 154, is joined by an active atomic reservoir (e.g., the active atomic reservoir 111*a* in FIG. 3) where a length of the ASC is 10 μm. As shown in FIG. 11, the active atomic reservoir provides a much better boost to the EM performance of the conductor than the passive atomic reservoir.

In some embodiments, in addition to boosting the EM performance of an IC, active atomic reservoirs may be used for enhancing circuit density in the IC, according to aspects of the present disclosure.

Figure 12B:
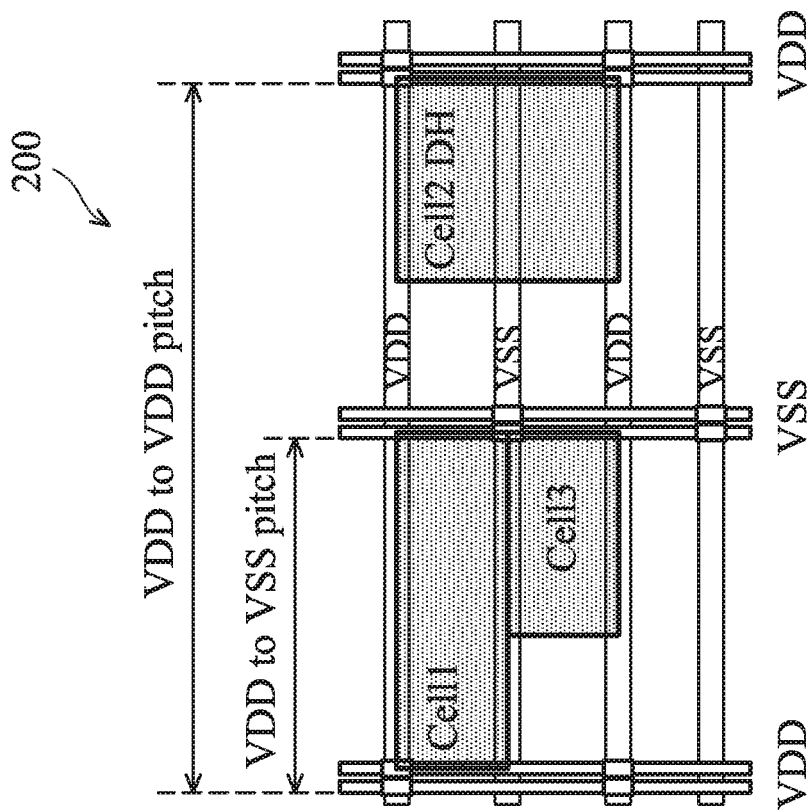
FIGS. 12A and 12B illustrate exemplary power grid and standard cell placements in an IC, in accordance with an embodiment.
Figure 12A:
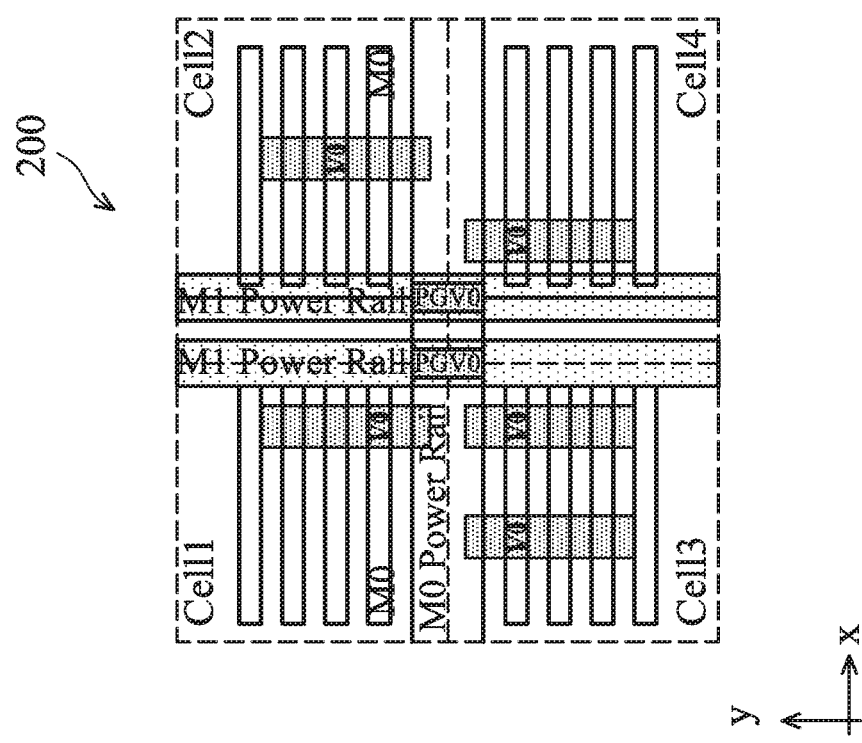

As semiconductor fabrication advances to smaller and smaller geometrical sizes, power rail design and layout may sometimes become a bottleneck for further increasing circuit density. As merely examples, FIGS. 12A and 12B illustrate some layout of an IC 200 having standard cells and power rails, constructed according to an embodiment of the present disclosure. The standard cells (such as cells 1, 2, 3, and 4) have predesigned logic gates and transistors. The power rails (such as M0 Power Rail and M1 Power Rail) supply voltages, such as VDD (positive supply voltage) and VSS (negative supply voltage), to the standard cells. The power rails are configured as horizontal and vertical lines in the form of a grid, which is sometimes referred to as a power grid. As further shown in FIG. 12B, the power rails for VSS and VDD are alternately placed in both the horizontal and vertical directions. The standard cells are placed in space between the power rails. It is generally limited (e.g., by design rules) how many standard cells may be placed between two adjacent power rails. In the examples shown in FIGS. 12A and 12B, either one cell or half of a cell (such as in the case of "Cell2 DH" in FIG. 12B) is placed between two adjacent power rails. The power rails share the same layout space with the standard cells even though they are at different layers of the IC. Due to EM concerns, the power rails, which are metal conductors, are usually designed to be wide strips. It has been observed that the widths of the power rails consume about 33% of the layout resources in some standard cell designs (the lengths of the power rails are of a less concern generally). If the widths of the power rails are reduced (which is the case in the IC 200, as discussed below), the saved space can be used for placing more standard cells in an IC, thereby increasing the circuit density thereof.

Accordingly, an object of the present disclosure is to reduce widths of power rails in an IC and to use active atomic reservoirs to boost the EM performance of the reduced-width power rails. The active atomic reservoirs are placed in a way that they do not consume layout resources that can be used for standard cells. This effectively increases the circuit density of the IC. The combination of the active atomic reservoirs and the reduced-width power rails provides comparable or better EM performance than the full-width power rails without the active atomic reservoir. According to some embodiments, the active atomic reservoirs are placed directly underneath other power rails in upper routing layer(s) and do not consume additional routing resources reserved for the standard cells. In some further embodiments, the active atomic reservoirs have smaller footprints than those power rails, i.e., they are hidden underneath those power rails from a top view. Embodiments according to the present disclosure may effectively increase the circuit density of an IC, such as by 10% to 12% in some cases, while alleviating concerns for EM.

Figure 13A:
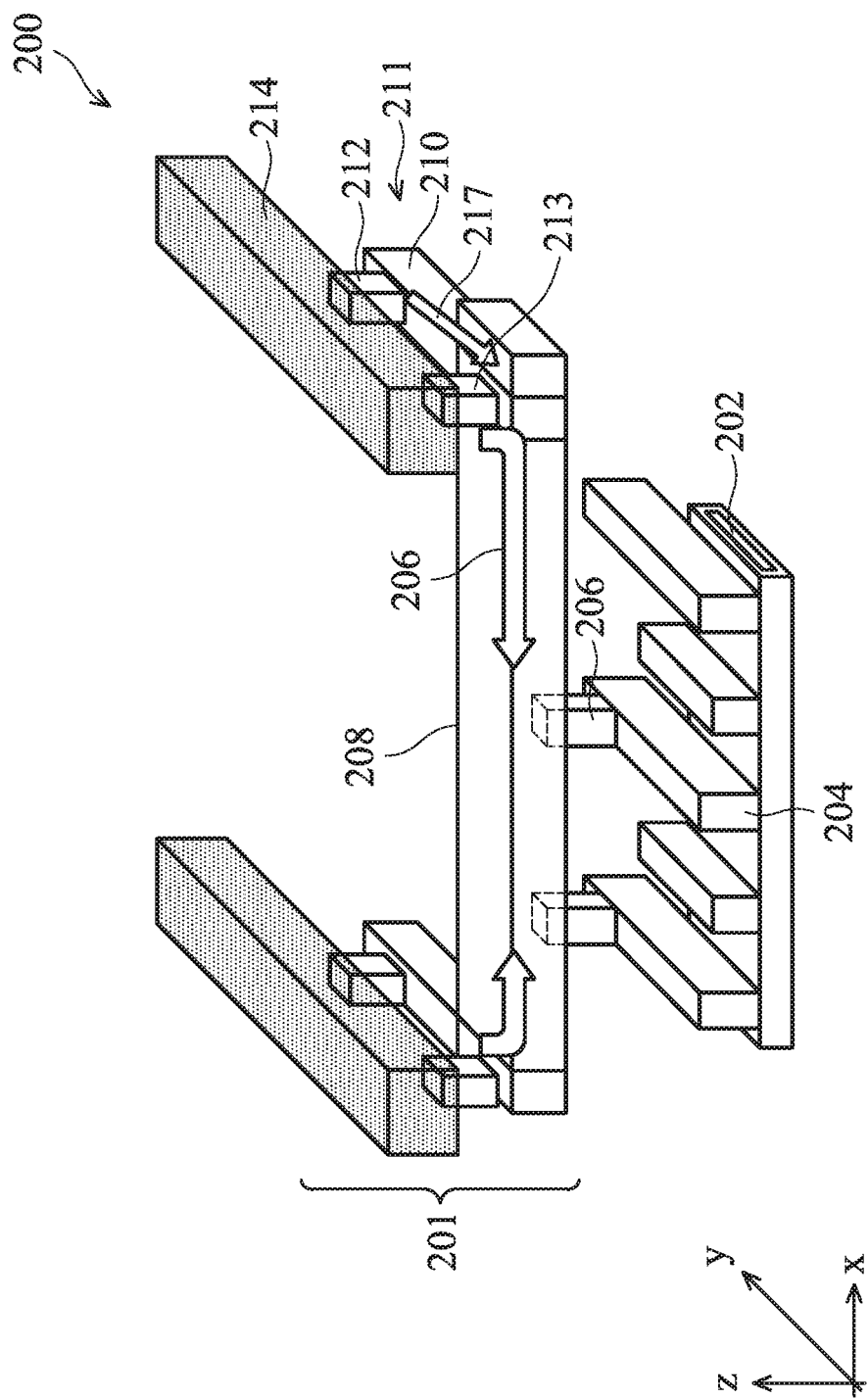
FIG. 13A is a fragmentary perspective view of an IC having active atomic reservoirs on a power grid, constructed according to various aspects of the present disclosure.

FIG. 13A shows a fragmentary perspective view of the IC 200 having a power grid 201 whose EM performance is boosted by active atomic reservoirs, constructed according to various aspects of the present disclosure. Referring to FIG. 13A, the power grid 201 includes power rails 214 (two shown) and power rails 208 (one shown) at separate wiring layers (such as the wiring layers 104 of FIG. 1). The power rails 208 are oriented lengthwise along the "x" direction, while the power rails 214 are oriented lengthwise along the "y" direction generally perpendicular to the "x" direction. Here, the term "generally perpendicular" means the directions "x" and "y" form an angle that is either 90 degrees or close to 90 degrees due to standard manufacturing deviation(s) (e.g., overlay alignment deviation). The power rails 214 and 208 may each comprise copper (Cu), aluminum (Al), tungsten (W), cobalt (Co), silver (Ag), gold (Au), or other suitable metals. The IC 200 includes a substrate 202 which includes various active and/or passive regions and devices. In an embodiment, the substrate 202 is the same as or similar to the substrate 102. The IC 200 further includes device-level contacts 204, such as source contacts, drain contacts, gate contacts, and local interconnects electrically connecting multiple source and/or drain contacts. The device-level contacts 204 are below the wiring layer having the power rails 208 and are connected to the power rails 208 through vias 206. In the example shown, the power rails 208 are at the lowest metal wiring layer 104 (sometimes referred to as the "M0" layer), while the power rails 214 are at the metal wiring layer directly above the M0 layer (i.e., they are at the "M1" layer). The power rails 208 and 214 are connected through vias 213.

In the present embodiment, a width of the power rail 208 (e.g., its dimension along the "y" axis) is reduced, compared to a regular design having no active atomic reservoirs. This is for increasing the circuit density of the IC 200 as discussed above. To boost the EM performance of the power rail 208, the IC 200 further includes an active atomic reservoir 211. In this embodiment, the active atomic reservoir 211 includes an ASC 210 that is connected to the power rail 214 through a via 212. The ASC 210 is placed at the same wiring layer as the power rail 208 and is oriented lengthwise along the "y" direction. In this embodiment, the ASC 210 physically joins the power rail 208. FIG. 13A further illustrates electron paths 216 and 217 when the IC 200 is in operation in accordance with an embodiment. The electron path 216 flows away from the via 213, along the power rail 208, and to the device-level contacts 204. The electron path 217 flows from the via 212, along the ASC 210, and to the power rail 208 adjacent the via 213. The current density along the electron path 216 is equal to or greater than the current density along the electron path 217. At least through the electron path 217, the ASC 210 compensates the power rail 208 for its loss of metallic ions due to EM.

Figure 13B:
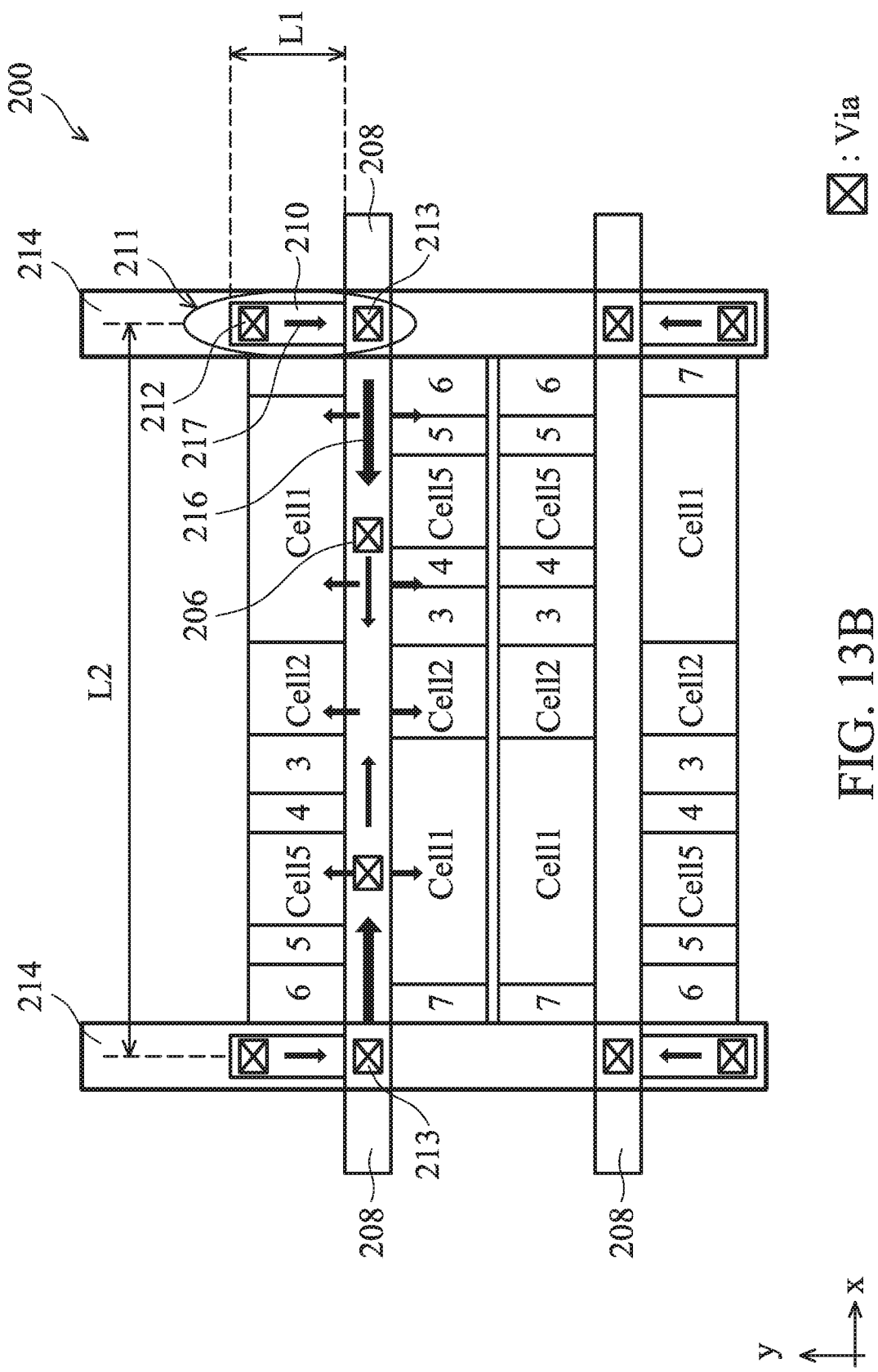
FIG. 13B illustrates a top view of the IC of FIG. 13A having exemplary power grids, standard cells, and active atomic reservoirs, in accordance with an embodiment.

FIG. 13B illustrates a top view of a portion of the IC 200, particularly having the power rails 208 and 214 and the active atomic reservoir 211. Referring to FIG. 13B, the IC 200 include various standard cells (cells 1, 2, 3, 4, 5, 6, and 7) alongside of the power rails 208. The standard cells 1-7 may include memory cells, logic gates, PFET, NFET, MOSFET, CMOS, FINFET, resistors, capacitors, inductors, and other suitable circuit elements. The standard cells 1-7 may at least partially reside in the active regions of the substrate 202. The power rails 208 and 214 are biased to the same voltage (VSS in this embodiment) and are connected through the vias 213. For the purpose of simplicity, VDD power rails between the power rails 208 and between the power rails 214 are not shown.

Still referring to FIG. 13B, the power rail 214 has larger dimensions than the ASC 210 along both the "x" and "y" directions. The ASC 210 and the via 212 are directly beneath the power rail 214 and in space not used or reserved for placing standard cells. Therefore, the active atomic reservoir 211 does not consume extra layout and routing resources as far as the circuit density of the IC 200 is concerned.

FIG. 13B further illustrates the directions of various electron paths including the electron paths 216 and 217 and electron paths from the power rail 208 to the standard cells 1-7. In various embodiments, the current density 217 is controlled to be much smaller than the current density 216 so that the active atomic reservoir 211 does not become an EM bottleneck of the IC 200. For example, the via 213 may be designed to be a large via or a group of vias (as will be shown in FIG. 14) to provide a lower resistance than the via 212.

In some embodiments, the length L1 of the ASC 210 (along the "y" direction) is maximized, which increases the EM performance of the power rail 208. Generally, the ratio between L1 and L2 (the length of the power rail 208 along the "x" direction between two vias 213) is proportional to EM margin gain. The length L1 may be maximized as close to the distance between the power rail 208 and an adjacent power rail (not shown in FIG. 13B but shown in FIGS. 14 and 15) in the same wiring layer.

Figure 14:
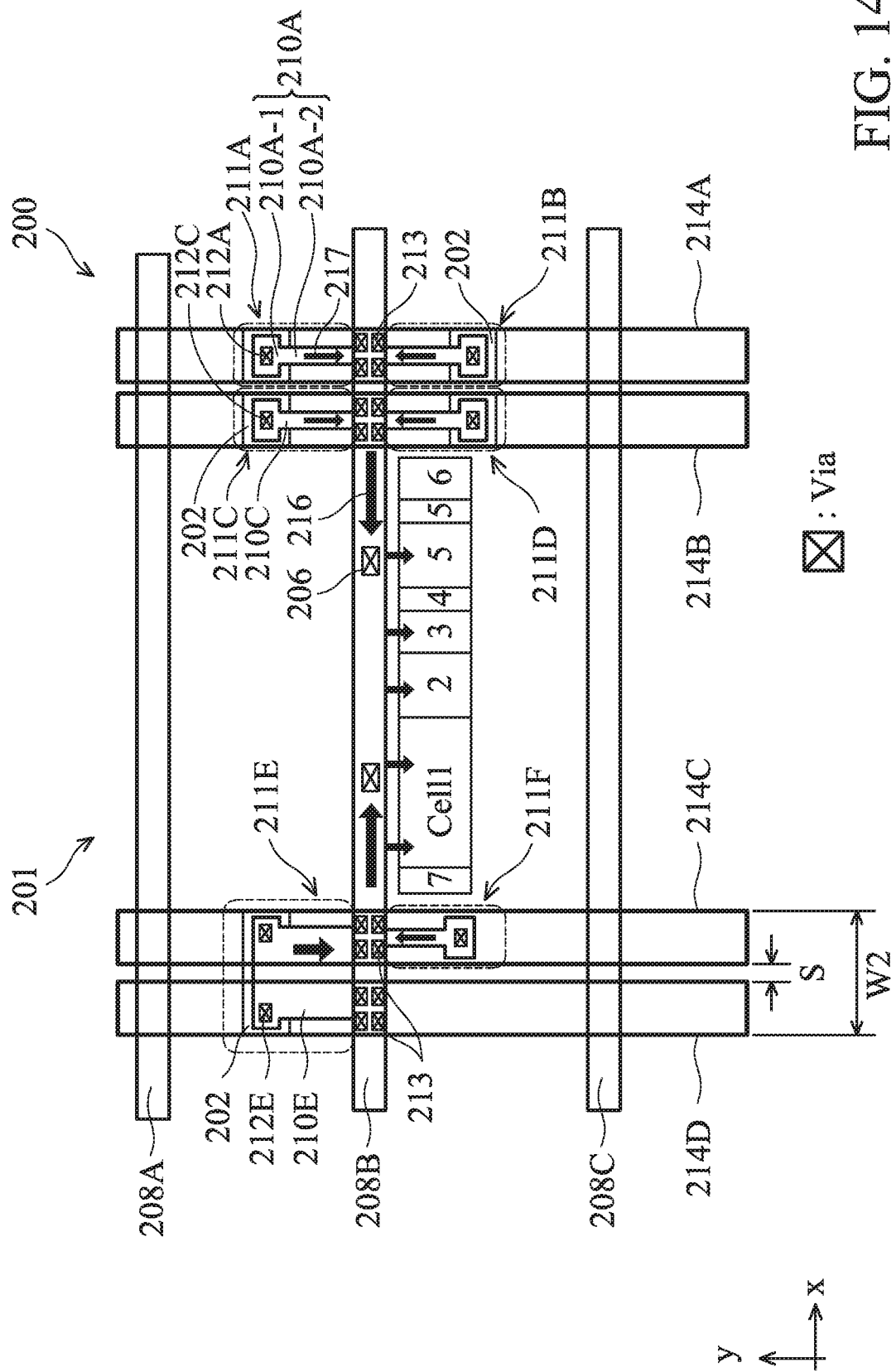
FIGS. 14 and 15 illustrate exemplary power grids and active atomic reservoirs in the IC of FIG. 13A, in accordance with some embodiments.

FIG. 14 illustrates a top view of an embodiment of the power grid 201 constructed according to aspects of the present disclosure. Referring to FIG. 14, the horizontal (along the "x" direction) power rails 208A, 208B, and 208C are assigned to different supply voltages alternately, in accordance with an embodiment. In the present embodiment, the power rails 208A and 208C are assigned to VDD, while the power rail 208B is assigned to VSS. The power rails 214A-D are assigned to the same supply voltage as the power rail 208B, which is VSS in this embodiment. The power rails 214A-D are electrically connected to the power rail 208B through the vias 213 at the various intersections between the power rails. In an embodiment, the power rails 208A-C and the power rails 214A-D are at two adjacent wiring layers. For example, the power rails 208A-C are at the M0 wiring layer, while the power rails 214A-D are at the M1 wiring layer. For another example, the power rails 208A-C are at the M1 wiring layer, while the power rails 214A-D are at the M2 wiring layer. In another embodiment, the power rails 214A-D are horizontal while the power rails 208A-C are vertical.

In the example shown in FIG. 14, at least the power rail 208B has a reduced width, as discussed above. To boost EM performance of the power rail 208B, various active atomic reservoirs are added to the IC 200, including active atomic reservoirs 211A, 211B, 211C, 211D, 211E, and 211F. The various active atomic reservoirs 211A-F are oriented vertically and are placed beneath power rails 214A, 214B, 214C, and 214D. Each of the active atomic reservoirs 211A-F includes an ASC. For example, the active atomic reservoirs 211A and 211E include ASCs 210A and 210E respectively. Each of the ASCs 211A-E has two ends, with one end joining the power rail 208 and the other end electrically connected to one or more power rails 214 and also connected to a floating active region in the substrate 202. In an embodiment, the floating active region is an n-type active region (e.g., a semiconductor having an n-type dopant), serving as a leakage path of electrons from a p-type substrate (e.g., a semiconductor having a p-type dopant) to the n-type active region. The leakage path limits the current density on the electron paths 217. In various embodiments, the ASCs (e.g., 210A) may be connected to the respective floating n-type active region through vias 206, the device-level contacts 204, and other appropriate conductive features as shown in FIG. 13A. The ASC 211F has one end joining the power rail 208 and the other end electrically connected to the power rail 214.

The active atomic reservoirs may be placed on one side or both sides of the reduced-width power rail. For example, the active atomic reservoir 211 is placed on one side of the power rail 208 in FIG. 13B. For example, the active atomic reservoirs 211A and 211B are placed on opposite sides of the power rail 208B adjacent the vias 213 for further boosting the EM performance of the power rail 208B. In a further embodiment, two or more active atomic reservoirs, such as 211A and 211C, may be placed side-by-side. The active atomic reservoirs 211A and 211C are connected to two parallel power rails 214A and 214B through vias 212A and 212C respectively. In this further embodiment, the ASCs 210A and 210C are connected to a common floating n-type active region in the substrate 202.

In still another embodiment as shown in the active atomic reservoir 211E, the ASC 210E is wider than a single strip of the power rail 214C (or 214D) but is narrower than the total width W2 defined by two adjacent power rails 214C and 214D, where W2 is the sum of the width of the power rail 214C, the width of the power rail 214D, and a width of a gap S between the power rails 214C and 214D (here, "width" is defined along the "x" axis). The space underneath the two adjacent power rails 214 is not used for placing standard cells (such as shown in FIG. 12A). Therefore, the ASC 210E does not consume additional layout resources as far as the circuit density is concerned. In this embodiment, the ASC 210E is still considered to be directly underneath the power rails 214. The wide conductor in the ASC 210E increases the reservoir area for the active atomic reservoir 211E. The length of the active atomic reservoirs 211A-F may be maximized to increase EM margin gain. For example, each of the active atomic reservoirs 211A-F may extend as close to the power rails 208A or 208C as the design rules allow without shorting to the power rails 208A and 208C (i.e., they are spaced from the power rails 208A and 208C).

Within each of the active atomic reservoirs 211A-E, the ASC may have two or more portions or sections. Taking the active atomic reservoir 211A as an example, the ASC 210A has two portions 210A-1 and 210A-2. The via 212A lands on the portion 210A-1, and the portion 210A-2 connects the portion 210A-1 to the power rail 208B.

In embodiments, some via designs may be used for reducing resistance between the power rails 214 and 208, thereby ensuring the current density 216 is greater than the current density 217. For example, a group of vias 213 may be placed at each of the intersections of the power rails 214 and 208, as shown in FIG. 14. For another example, a via larger than the minimize size (such as a large square via) is used for the vias 213.

Figure 15:
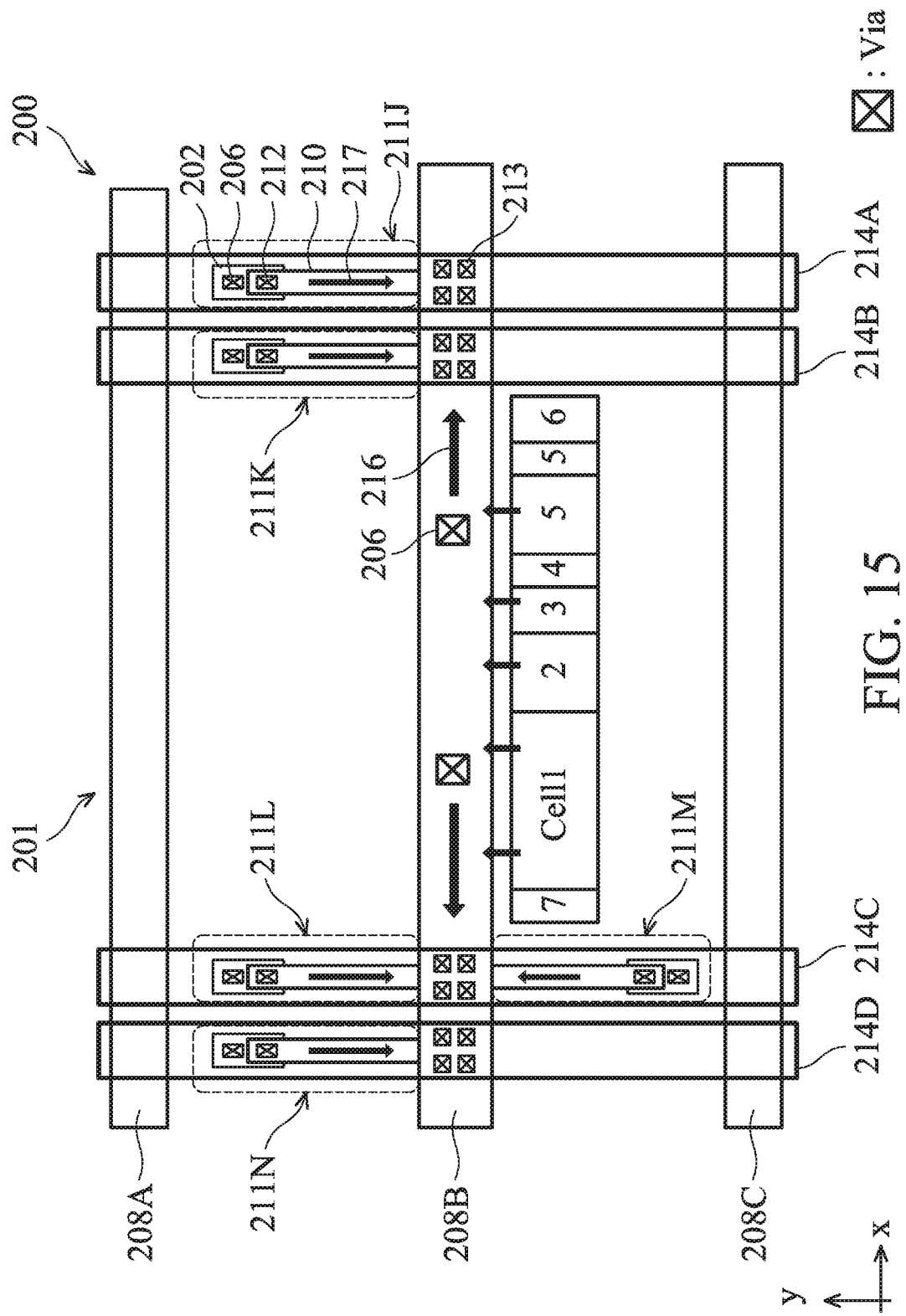

FIG. 15 illustrates another embodiment of the power grid 201 constructed according to aspects of the present disclosure. Referring to FIG. 15, in this embodiment, the power rails 208A and 208C are assigned to VSS, while the power rails 208B and 214A-D are assigned to VDD. At least the power rail 208B has a reduced width and various active atomic reservoirs 211J, 211K, 211L, 211M, and 211N are added to boost the EM performance of the power rail 208B. FIG. 15 further illustrates various electron paths including the electron path 217 to the vias 213 along the ASCs 210, the electron path 216 to the vias 213 along the power rail 208B, and various electron paths from the standard cells 1-7 to the power rail 208B. Comparing FIGS. 14 and 15 reveals that the electron path 217 has the same direction in both designs. This ensures that the active atomic reservoirs 211A-F and 211J-N properly compensate the power rail 208B in the respective design. Similar to the active atomic reservoirs 211A-E, each of the active atomic reservoirs 211J-N has one end of its ASC joining the power rail 208B and the other end of its ASC connecting to the power rails 214A-D and also connecting to a floating n-type active region in the substrate 202. Other aspects of the power grid 201 in FIG. 15 are similar to those in FIG. 14.

Although not intended to be limiting, one or more embodiments of the present disclosure provide many benefits to a semiconductor device and the formation thereof. For example, embodiments of the present disclosure provide active atomic reservoirs in various configurations. Particularly, active atomic reservoirs are used for boosting EM performance of power rails in some embodiments. The widths of those power rails can be advantageously reduced, and the saved space is used for packing more circuit elements into an IC. Further, the active atomic reservoirs are added in space not used or reserved for placing standard cells. Therefore, embodiments of the present disclosure can effectively increase circuit density in an IC while alleviating concerns for EM.

In one exemplary aspect, the present disclosure is directed to an integrated circuit (IC). The IC comprises first and second conductors in one layer of the IC, wherein the first conductor is oriented along a first direction, the second conductor is oriented along a second direction generally perpendicular to the first direction, and the second conductor is electrically connected to the first conductor. The IC further comprises a third conductor in another layer of the IC, oriented along the second direction, and above the second conductor; a first via connecting the first and third conductors; and a second via connecting the second and third conductors.

In another exemplary aspect, the present disclosure is directed to an integrated circuit (IC). The IC comprises first and second conductors in one layer of the IC, wherein the first conductor is oriented along a first direction, the second conductor is oriented along a second direction generally perpendicular to the first direction, and the second conductor physically joins the first conductor. The IC further comprises a third conductor in another layer of the IC, oriented along the second direction, and above the second conductor; a first via connecting the first and third conductors; a second via connecting the second and third conductors; and an n-type active region under the one layer of the IC and electrically connected to the second conductor. The first and third conductors are power rails of the IC and are configured to be biased to a first voltage In another exemplary aspect, the present disclosure is directed to an integrated circuit (IC). The IC comprises first and second conductors in one layer of the IC, wherein the first conductor is oriented along a first direction, the second conductor is oriented along a second direction generally perpendicular to the first direction, and a portion of the second conductor is joined to the first conductor. The IC further comprises a third conductor in another layer of the IC, oriented along the second direction, and directly above the second conductor; a first via connecting the first and third conductors; a second via connecting the second and third conductors; an n-type active region under the one layer of the IC and electrically connected to the second conductor; and a fourth conductor in the one layer of the IC and oriented along the first direction. The second conductor is spaced from the fourth conductor. The first, third, and fourth conductors are power rails of the IC. The first and third conductors are configured to be biased to a first voltage. The fourth conductor is configured to be biased to a second voltage different from the first voltage.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first power rail configured for biasing to a first voltage, wherein the first power rail includes a first portion oriented along a first direction and a second portion oriented along a second direction that is substantially perpendicular to the first direction, wherein the second portion is physically connected to the first portion;
   forming a second power rail configured for biasing to a second voltage, wherein the second power rail is oriented along the second direction, wherein a width of the second portion of the first power rail is different than a width of the second power rail; and
   forming a first via that connects the first portion of the first power rail to the second power rail and a second via that connects the second portion of the first power rail to the second power rail.

2. The method of claim 1, wherein the forming the first power rail, the second power rail, the first via, and the second via includes forming a portion of an interconnect structure of an integrated circuit.

3. The method of claim 2, wherein the forming the portion of the interconnect structure of the integrated circuit includes:
forming a first metal layer of the interconnect structure, wherein the first power rail is formed during the forming of the first metal layer;
forming a via layer of the interconnect structure over the first metal layer, wherein the first via and the second via are formed during the forming of the via layer; and
forming a second metal layer of the interconnect structure over the via layer, such that second metal layer is disposed directly above and directly adjacent to the first metal layer, wherein the second power rail is formed during the forming of the second metal layer.

4. The method of claim 3, wherein the forming the second metal layer and the forming the via layer includes performing a dual damascene process.

5. The method of claim 3, wherein the first metal layer is a lowest metal layer of the interconnect structure.

6. The method of claim 1, wherein the forming the first power rail, the forming the second power rail, and the forming the first via and the second via each include:
forming at least one opening in a dielectric layer; and
filling the at least one opening with a metal diffusion barrier layer and a metal plug, wherein the metal plug is disposed over the metal diffusion barrier layer.

7. The method of claim 1, wherein the width of the second portion of the first power rail is less than the width of the second power rail.

8. The method of claim 1, wherein the width of the second portion of the first power rail is greater than the width of the second power rail.

9. The method of claim 1, wherein the second portion of the first power rail is positioned in a space not reserved for a standard cell.

10. The method of claim 1, further comprising forming a third via that connects the second portion of the first power rail to a doped region in a substrate.

11. A method comprising:
forming a first power rail, a second power rail, a first conductor, and a second conductor in a first metal layer of an interconnect structure, wherein the first power rail and the second power rail extend lengthwise along a first direction, the first conductor and the second conductor extend lengthwise along a second direction that is different than the first direction, and the first conductor and the second conductor are connected to the first power rail;
forming a third power rail and a fourth power rail in a second metal layer of the interconnect structure, wherein the third power rail and the fourth power rail are oriented lengthwise along the second direction; and
forming a first via, a second via, a third via, and a fourth via, wherein the first via connects the first power rail to the third power rail, the second via connects the first power rail to the fourth power rail, the third via connects the first conductor to the third power rail, and the fourth via connects the second conductor to the fourth power rail.

12. The method of claim 11, wherein a length of the first conductor is less than a length of the third power rail and a length of the second conductor is less than a length of the fourth power rail.

13. The method of claim 11, further comprising:
forming a fifth power rail, a sixth power rail, a third conductor, and a fourth conductor in the first metal layer of the interconnect structure, wherein the fifth power rail and the sixth power rail extend lengthwise along the second direction, the third conductor and the fourth conductor extend lengthwise along the second direction, the third conductor is connected to the first power rail, and the fourth conductor is connected to the first power rail; and
forming a fifth via and a sixth via, wherein the fifth via connects the third conductor to the fifth power rail and the sixth via connects the fourth conductor to the sixth power rail.

14. The method of claim 11, further comprising:
forming a fifth power rail, a sixth power rail, and a third conductor in the first metal layer of the interconnect structure, wherein the fifth power rail and the sixth power rail extend lengthwise along the second direction, the third conductor extends lengthwise along the second direction, and the third conductor is connected to the first power rail; and
forming a fifth via and a sixth via, wherein the fifth via connects the first conductor to the fifth power rail and the sixth via connects the third conductor to the sixth power rail.

15. The method of claim 14, wherein:
the fifth power rail is adjacent to the third power rail and the sixth power rail is adjacent to the fourth power rail; and
a width of the first conductor is less than a sum of a width of the fifth power rail, a width of a gap between the fifth power rail and the third power rail, and a width of the third power rail.

16. The method of claim 11, further comprising forming a fifth via and a sixth via, wherein the fifth via connects the first conductor to a first doped region of a substrate and the sixth via connects the second conductor to a second doped region of the substrate.

17. The method of claim 11, wherein the forming the first via and the second via includes forming an array of vias.

18. A method comprising:
forming a first dielectric layer over a substrate;
performing a first lithography process to define a first trench and a second trench in the first dielectric layer, wherein the first trench extends lengthwise along a first direction, the second trench extends lengthwise along a second direction that is different than the first direction, and the second trench is connected to the first trench;
filling the first trench and the second trench with a first metal material to form a first power rail having a first portion that extends lengthwise along the first direction and a second portion that extends lengthwise along the second direction, wherein the second portion is connected to the first portion;
forming a second dielectric layer over the first dielectric layer;
performing a second lithography process to define a third trench in the second dielectric layer, wherein the third trench is disposed directly over the second portion of the first power rail and extends lengthwise along the second direction, and further wherein the third trench has a first lower portion that exposes the first portion of the first power rail, a second lower portion that exposes the second portion of the first power rail, and an upper portion that spans the first lower portion and the second lower portion; and filling the third trench with a second metal material to form a first via in the first lower portion of the third trench, a second via in the second lower portion of the third trench, and a second power rail in the upper portion of the third trench, wherein the first via connects the first portion of the first power rail to the second power rail and the second via connects the second portion of the first power rail to the second power rail.

19. The method of claim 18, wherein a length of the second trench is about 0.02 μm to about 2 μm.

20. The method of claim 18, wherein the first dielectric layer and the second dielectric layer include a low-k dielectric material, and the first metal material and the second metal material includes tantalum, copper, aluminum, tungsten, cobalt, silver, gold, or combinations thereof.

* * * * *